United States Patent
Enzmann et al.

(10) Patent No.: US 11,205,885 B2
(45) Date of Patent: Dec. 21, 2021

(54) LASER BAR AND SEMICONDUCTOR LASER AND METHOD OF PRODUCING LASER BARS AND SEMICONDUCTOR LASERS

(71) Applicant: OSRAM Opto Semiconductors GmbH, Regensburg (DE)

(72) Inventors: Roland Heinrich Enzmann, Gelugor (MY); Hubert Halbritter, Dietfurt (DE); Markus Bröll, Cork (IE)

(73) Assignee: OSRAM OLED GmbH, Regensburg (DE)

(*) Notice: Subject to any disclaimer, the term of this patent is extended or adjusted under 35 U.S.C. 154(b) by 36 days.

(21) Appl. No.: 16/490,171

(22) PCT Filed: Apr. 16, 2018

(86) PCT No.: PCT/EP2018/059687
§ 371 (c)(1),
(2) Date: Aug. 30, 2019

(87) PCT Pub. No.: WO2018/192882
PCT Pub. Date: Oct. 25, 2018

(65) Prior Publication Data
US 2020/0388988 A1 Dec. 10, 2020

(30) Foreign Application Priority Data
Apr. 20, 2017 (DE) .......................... 102017108385.5

(51) Int. Cl.
*H01S 5/0233* (2021.01)
*H01S 5/023* (2021.01)
(Continued)

(52) U.S. Cl.
CPC .............. *H01S 5/023* (2021.01); *H01S 5/021* (2013.01); *H01S 5/0218* (2013.01);
(Continued)

(58) Field of Classification Search
CPC ...... H01S 5/023; H01S 5/0235; H01S 5/0233; H01S 5/021; H01S 5/0218; H01S 5/4025; H01S 5/04256; H01S 2301/176
See application file for complete search history.

(56) References Cited

U.S. PATENT DOCUMENTS 6,281,032 B1 8/2001 Matsuda et al.
2002/0172244 A1 11/2002 Li et al.
(Continued)

FOREIGN PATENT DOCUMENTS

DE 20 2006 005 148 U1 8/2007
DE 10 2008 014 121 A1 6/2009
(Continued)

*Primary Examiner* — Yuanda Zhang
(74) *Attorney, Agent, or Firm* — DLA Piper LLP (US)

(57) ABSTRACT

A method of producing laser bars or semiconductor lasers includes providing a carrier composite to form a plurality of carriers for the laser bars or for the semiconductor lasers, providing a semiconductor body composite including a common substrate and a common semiconductor layer sequence grown thereon, forming a plurality of separation trenches through the common semiconductor layer sequence such that the semiconductor body composite is divided into a plurality of semiconductor bodies, applying the semiconductor body composite to the carrier composite such that the separation trenches face the carrier composite, thinning or removing the common substrate, and singulating the carrier composite into a plurality of carriers, wherein a plurality of semiconductor bodies are arranged on one of the carriers, and the semiconductor bodies arranged on one common carrier are laterally spaced apart from one another by the separation trenches.

10 Claims, 11 Drawing Sheets

(51) Int. Cl.
*H01S 5/02* (2006.01)
*H01S 5/40* (2006.01)
*H01S 5/0235* (2021.01)
*H01S 5/042* (2006.01)

(52) U.S. Cl.
CPC .......... *H01S 5/0233* (2021.01); *H01S 5/0235* (2021.01); *H01S 5/4025* (2013.01); *H01S 5/04256* (2019.08); *H01S 2301/176* (2013.01)

(56) References Cited

U.S. PATENT DOCUMENTS

| | | |
|---|---|---|
| 2003/0189215 A1 | 10/2003 | Lee et al. |
| 2004/0137655 A1 | 7/2004 | Chikuma et al. |
| 2004/0200573 A1* | 10/2004 | Dudoff ................ H01L 33/0095 156/345.1 |
| 2004/0247005 A1 | 12/2004 | Schrodinger et al. |
| 2005/0104083 A1 | 5/2005 | Bader et al. |
| 2010/0189146 A1* | 7/2010 | Bessho ................ H01S 5/4043 372/43.01 |
| 2010/0200864 A1 | 8/2010 | Bader et al. |
| 2011/0175238 A1 | 7/2011 | Illek |
| 2011/0198665 A1 | 8/2011 | Furukawa |
| 2015/0207293 A1 | 7/2015 | Enzmann et al. |
| 2015/0229107 A1 | 8/2015 | McLaurin et al. |
| 2015/0349487 A1 | 12/2015 | Enzmann et al. |
| 2018/0351324 A1 | 12/2018 | Walter et al. |
| 2021/0288464 A1 | 9/2021 | Frolich et al. |

FOREIGN PATENT DOCUMENTS

| | | |
|---|---|---|
| DE | 20321880 U1 | 11/2011 |
| DE | 10 2012 107 409 A1 | 2/2014 |
| DE | 10 2015 116 092 A1 | 3/2017 |
| DE | 10 2017 108 050 A1 | 10/2018 |
| WO | 2016/120400 A1 | 8/2016 |

* cited by examiner

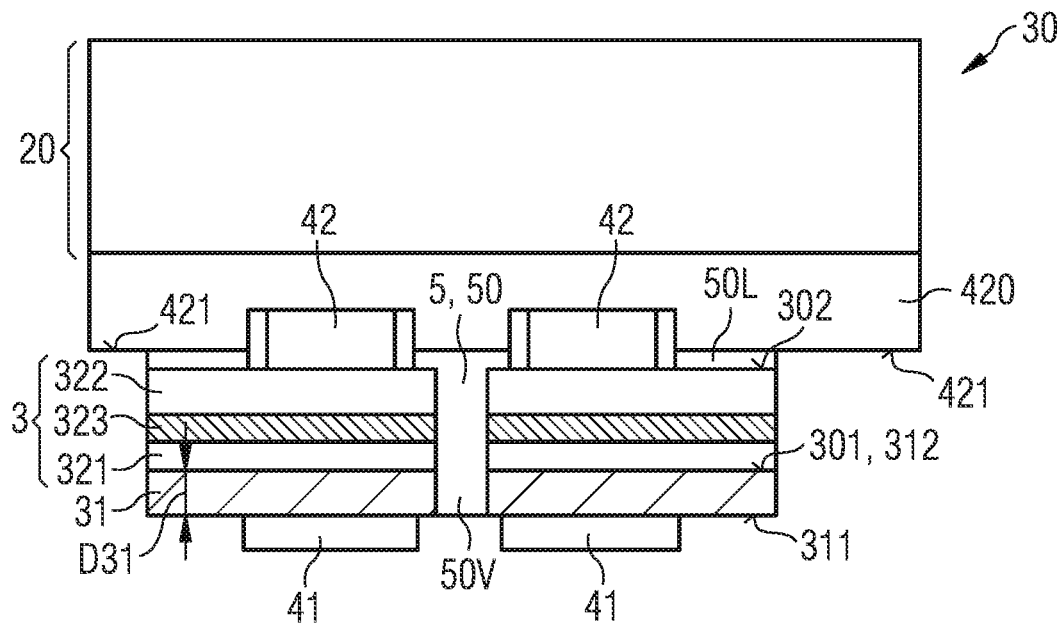
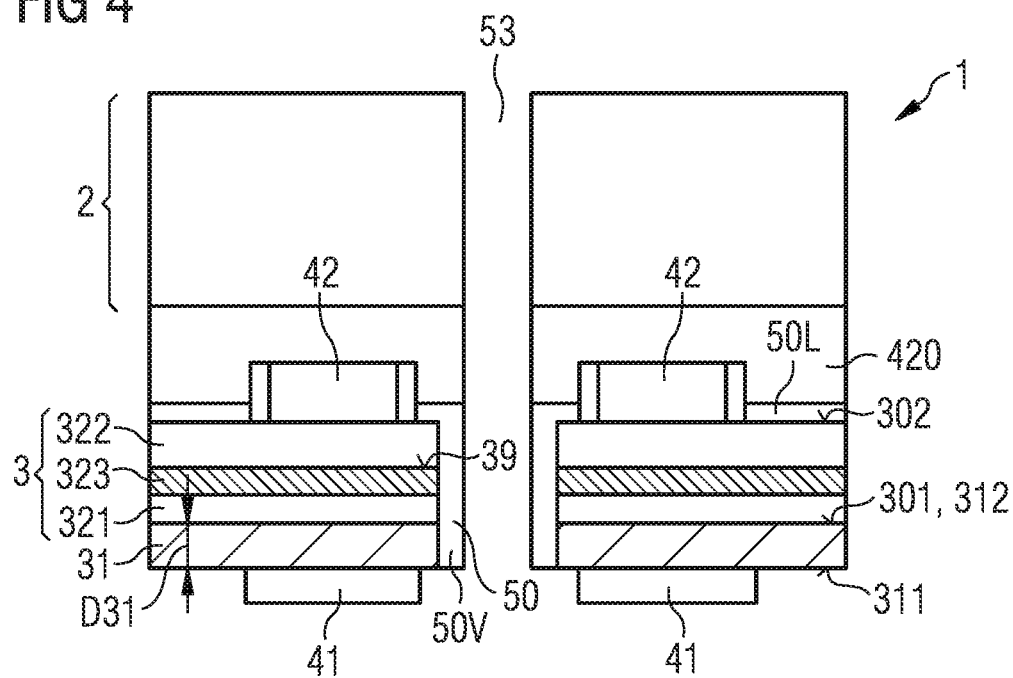

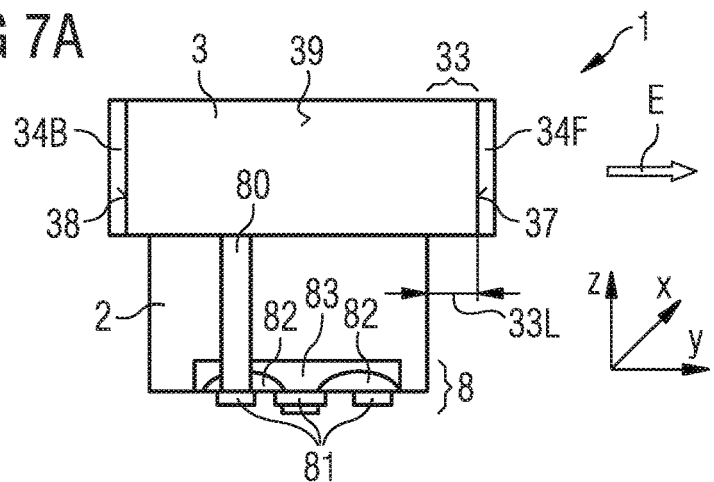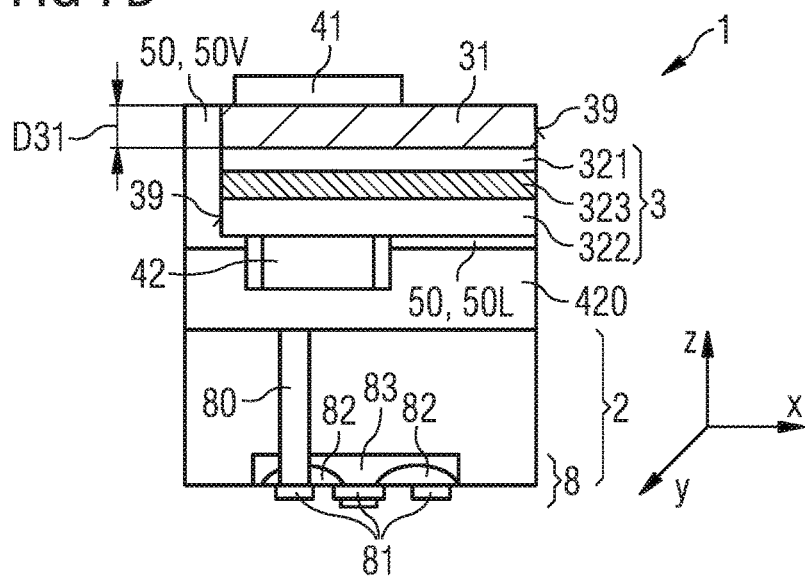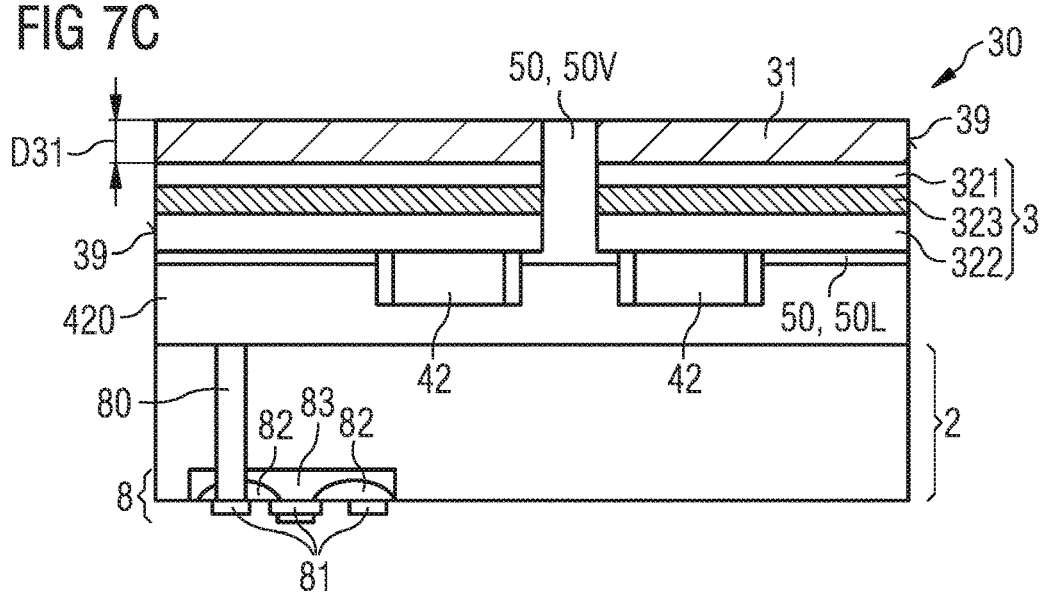

LASER BAR AND SEMICONDUCTOR LASER AND METHOD OF PRODUCING LASER BARS AND SEMICONDUCTOR LASERS

TECHNICAL FIELD

This disclosure relates to a method of producing laser bars and semiconductor lasers, a semiconductor laser and a laser bar.

BACKGROUND

Laser bars, in particular infrared high-power lasers formed on a common growth substrate, may have individual n-contacts and individual p-contacts. Due to the low but not vanishing transverse conductivity of the growth substrate, high-power lasers often cannot be controlled independently from each other. Especially for high-current applications and/or for ultra-short pulse applications, for example, in the nanosecond range it is technically particularly challenging to realize ultra-short pulse lasers or ultra-short pulse laser bars.

There is thus a need to provide an efficient semiconductor laser and/or an efficient laser bar for high current applications and/or for ultrashort pulse applications and a method of producing one or a plurality of laser bars and/or semiconductor lasers.

SUMMARY

We provide a method of producing laser bars or semiconductor lasers including providing a carrier composite to form a plurality of carriers for the laser bars or for the semiconductor lasers, providing a semiconductor body composite including a common substrate and a common semiconductor layer sequence grown thereon, forming a plurality of separation trenches through the common semiconductor layer sequence such that the semiconductor body composite is divided into a plurality of semiconductor bodies, applying the semiconductor body composite to the carrier composite such that the separation trenches face the carrier composite, thinning or removing the common substrate, and singulating the carrier composite into a plurality of carriers, wherein a plurality of semiconductor bodies are arranged on one of the carriers, and the semiconductor bodies arranged on one common carrier are laterally spaced apart from one another by the separation trenches.

We also provide a semiconductor laser including a carrier and a semiconductor body arranged thereon, wherein the semiconductor body has a vertically extending lateral front face, the semiconductor body includes a first semiconductor layer, a second semiconductor layer and an active zone disposed in a vertical direction between the first and second semiconductor layers, in operation of the semiconductor laser, the active zone is configured to generate electromagnetic radiation, a main emission direction of the semiconductor laser being oriented transversely to the front face, and the semiconductor laser is free of a growth substrate or on an top surface of the semiconductor body facing away from the carrier, has a thin growth substrate having a vertical layer thickness of 1 µm to 100 µm.

We further provide a laser bar including a plurality of semiconductor lasers including a carrier and a semiconductor body arranged thereon, wherein the semiconductor body has a vertically extending lateral front face, the semiconductor body includes a first semiconductor layer, a second semiconductor layer and an active zone disposed in a vertical direction between the first and second semiconductor layers, in operation of the semiconductor laser, the active zone is configured to generate electromagnetic radiation, a main emission direction of the semiconductor laser being oriented transversely to the front face, and the semiconductor laser is free of a growth substrate or on an top surface of the semiconductor body facing away from the carrier, has a thin growth substrate having a vertical layer thickness of 1 µm to 100 µm, wherein the carriers of the semiconductor lasers include a common continuous carrier, the semiconductor lasers comprise semiconductor bodies having structure of the same kind, and the semiconductor bodies of the neighboring semiconductor lasers are adjacent to an insulating layer and spaced apart from each other by the insulating layer.

We still further provide a semiconductor laser including a carrier and a semiconductor body arranged thereon, wherein the semiconductor body has a vertically extending lateral front face, the semiconductor body includes a first semiconductor layer, a second semiconductor layer and an active zone disposed in a vertical direction between the first and second semiconductor layers, in operation of the semiconductor laser, the active zone is configured to generate electromagnetic radiation, a main emission direction of the semiconductor laser being oriented transversely to the front face, the semiconductor laser is free of a growth substrate or on an top surface of the semiconductor body facing away from the carrier, has a thin growth substrate having a vertical layer thickness of 1 µm to 100 µm, a transistor or a plurality of transistors is/are generated at least partially or completely within the carrier of the semiconductor laser, and the transistor electrically connects directly to the semiconductor body throughout the carrier.

BRIEF DESCRIPTION OF THE DRAWINGS

FIG. 3 shows an example of a laser bar in schematic sectional view.

FIG. 4 shows an example of a method step of singulating a laser bar into a plurality of semiconductor lasers in a schematic cross-sectional view.

FIGS. 7A, 7B, 7C and 7D show further examples of a semiconductor laser or a laser bar in schematic sectional views.

LIST OF REFERENCE SIGNS

Figure 1A:
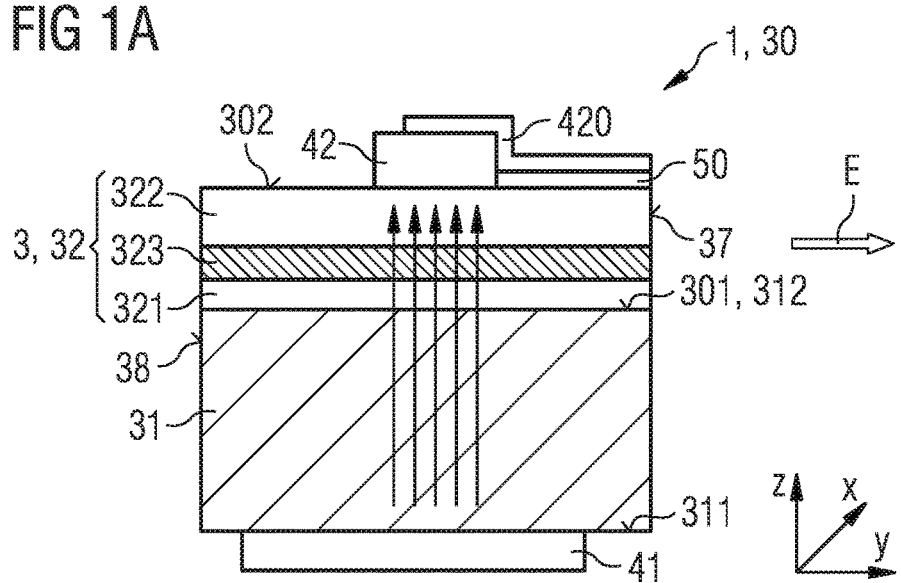
FIGS. 1A and 1B show comparison examples for a semiconductor laser or a laser bar.

1 Semiconductor laser
2 Carrier of the semiconductor laser
20 Common carrier of the laser bar
200 Carrier composite
3 Semiconductor body 30 Laser bars
300 Semiconductor body composite
301 Bottom surface of semiconductor body
302 Top surface of semiconductor body
31 Substrate/growth substrate
311 Bottom surface of the substrate
312 Top surface of the substrate
32 Semiconductor layer sequence
321 n-side of the semiconductor layer sequence
322 p-side of the semiconductor layer sequence
323 active zone of semiconductor layer sequence
33 Protrusion of the semiconductor body
33L Lateral extension of the protrusion
34B Rear-side mirror layer
34F Front-side mirror layer
35 Predetermined breaking location in the semiconductor body composite
35L Predetermined breaking line in the semiconductor body composite
35S Separating gap
36 Marking layer
37 Front face/front side of semiconductor body
38 Rear side of the semiconductor body
39 Side face of the semiconductor body
41 n-side contact location
42 p-side contact location
420 Common contact layer
421 Connection location of the contact layer
5 Separation trench
50 Insulating layer
50V Vertically extending region of insulating layer
50L Laterally extending region of insulating layer
52 Further insulating layer
53 Singulating trench
6 Tension line
7 Further predetermined breaking location in the semiconductor composite/substrate
8 Transistor/field effect transistor
80 Through-via
81 Contact location of the transistor
82 Doped subarea of the carrier
83 Doped subarea of the carrier
E Main emission direction
C Capacitor

DETAILED DESCRIPTION

We provide a method of producing laser bars or semiconductor lasers and a semiconductor body composite. Preferably, the semiconductor body composite comprises a common substrate and a semiconductor layer sequence arranged on the substrate. In particular, the substrate is a growth substrate on which the semiconductor layer sequence is epitaxially grown. The semiconductor layer sequence comprises in particular a first semiconductor layer, a second semiconductor layer and an active zone located therebetween. For example, the first semiconductor layer forms an n-side and the second semiconductor layer a p-side of the semiconductor layer sequence, or vice versa. In operation of the semiconductor laser or the laser bar, the active zone is configured to generate electromagnetic radiation.

A carrier composite may be provided. The carrier composite may be applied to the semiconductor body composite such that the semiconductor layer sequence is arranged between the common substrate and the carrier composite. The common substrate can then be thinned or removed from the semiconductor layer sequence. In particular, the semiconductor layer sequence is separated into a plurality of semiconductor bodies by forming a plurality of separation trenches. The carrier composite can be singulated into a plurality of carriers, wherein several semiconductor bodies can be arranged on one of the carriers.

The semiconductor bodies on one common carrier form in particular a laser bar, wherein the semiconductor bodies can continue to be laterally spaced from each other by the separation trenches. In the presence of the separation trenches that are preferably filled with an electrically insulating material, the adjacent semiconductor bodies that are, for example, made of the same semiconductor layer sequence and arranged on the common carrier of the carrier composite, can be electrically isolated from each other.

A lateral direction is understood to mean a direction running along, in particular parallel to, a main extension surface of the semiconductor body or of the carrier. A vertical direction is understood to mean a direction directed transverse or perpendicular to the main extension surface. The vertical direction and the lateral direction are thus directed transverse or perpendicular to each other. The substrate is thinned when its vertical layer thickness is reduced, for example, by a mechanical and/or chemical process such as grinding and/or etching.

A carrier composite may be provided to form a plurality of carriers the laser bars or for the semiconductor lasers. A semiconductor body composite comprising a common substrate and a common semiconductor layer sequence grown thereon may also be provided. A plurality of separation trenches may be formed throughout the common semiconductor layer sequence so that the semiconductor body composite is divided into a plurality of semiconductor bodies. The semiconductor body composite may be applied to the carrier composite such that the separation trenches face the carrier composite. The common substrate may be thinned or removed from the semiconductor layer sequence. The carrier composite may be singulated into a plurality of carriers, wherein several semiconductor bodies are arranged on one of the carriers, and the semiconductor bodies arranged on one common carrier are laterally spaced apart from each other by the separation trenches.

The common carrier and the semiconductor bodies arranged thereon form a laser bar. The semiconductor bodies can be arranged in a row and/or in a column and separated from each other by the separation trenches. It is possible that after thinning the substrate, the separation trenches extend throughout the substrate. The semiconductor bodies are thus electrically separated by the separation trenches and can be controlled individually.

The separation trenches may be filled with an electrically insulating material, in particular before the semiconductor body composite is applied to the carrier composite. An insulating layer may thus be formed in the respective separation trenches, which electrically insulates adjacent semiconductor bodies. The electrically insulating material can be applied over the entire surface of the semiconductor layer sequence so that the insulating layer is formed such that it not only fills the separation trenches, but also covers the semiconductor layer sequence in particular completely except for electrical contact locations.

The substrate may be a growth substrate on which the semiconductor layer sequence is epitaxially grown. The growth substrate is preferably thinned or removed to expose the separation trenches.

The substrate is in particular a semiconductor substrate, for example, a GaAs substrate. The semiconductor layer sequence is based in particular on GaAs, for example, on $Al_nGa_mIn_{1-n-m}As$ with $0 \leq n \leq 1$, $0 \leq m \leq 1$ and $n+m \leq 1$. The semiconductor layer sequence and/or the substrate may contain dopants. Preferably, the active zone is configured to emit infrared laser radiation, for example, in the wavelength range of 790 nm to 940 nm, for instance 805 nm to 855 nm or 905 nm to 940 nm. It is also possible that the semiconductor layer sequence is based on the material system AlInGaN or InP or AlInGaAsP. An emission wavelength may be in the ultraviolet or blue spectral range or in the near infrared, for example, of 1 µm to 1.5 µm or 1.3 µm to 1.5 µm.

The separation trenches may be formed throughout the semiconductor layer sequence into the common substrate. In particular, the separation trenches do not extend throughout the common substrate. At first, the semiconductor bodies may still be arranged on the common continuous substrate. Only after the substrate has been thinned, wherein the separation trenches are exposed, or after the substrate has been removed, the semiconductor bodies of a laser bar are no longer mechanically and/or electrically connected via the substrate. In particular, after thinning, the common substrate is divided into a plurality of laterally spaced subregions. Each subregion of the substrate can be assigned to one of the semiconductor bodies. Each semiconductor body can also be assigned to a subregion of the substrate.

The semiconductor body composite may comprise an inner marking layer. The separation trenches can be formed as far as the marking layer or throughout the marking layer. In particular, the substrate is thinned or removed starting from a bottom surface of the substrate facing away from the semiconductor layer sequence towards the marking layer. For example, the marking layer is an etch stop layer or a lacquer layer. The marking layer can be formed in the substrate or in the semiconductor layer sequence.

The substrate may be thinned by at least 60% of its original vertical layer thickness, preferably by at least 70%, 80%, 90% or 95% of its original vertical layer thickness. After thinning, the substrate has a reduced vertical layer thickness, for example, 1 µm to 100 µm. In particular, the reduced vertical layer thickness is 1 µm to 50 µm, 5 µm to 40 µm, 10 µm to 30 µm, or 1 µm to 20 µm, for instance 3 µm to 10 µm.

The semiconductor layer sequence may have an n-side facing away from the carrier composite, a p-side facing towards the carrier composite and an active zone located therebetween. Preferably, a common p-side contact layer is applied to the semiconductor bodies so that the semiconductor bodies on the common carrier have the common p-side contact layer. The common p-side contact layer is located in particular between the common carrier and the semiconductor bodies. The n-side of the semiconductor layer sequence or of the respective semiconductor body faces the substrate.

The semiconductor bodies can each have an n-side contact location, wherein the n-side contact locations of different semiconductor bodies are spatially separated from each other. The n-side contact locations can be formed on one of the laterally spaced subregions of the substrate having the reduced vertical layer thickness. The semiconductor bodies can be individually interconnected via the n-side contact locations and thus are individually controllable.

The semiconductor composite may be singulated into a plurality of rows of semiconductor bodies. Each row of semiconductor bodies can be assigned to one of the laser bars to be produced. The rows of the semiconductor bodies are arranged for instance on the contiguous carrier composite and laterally spaced apart from each other by separating gaps.

Predetermined breaking lines may be formed in the semiconductor body composite, in particular before the semiconductor body composite is applied to the carrier composite. The predetermined breaking lines may define in particular the geometry of the laser bars to be produced. For example, exactly one predetermined breaking line is provided between each two laser bars. Preferably, the predetermined breaking lines are formed partially in the common substrate. In a plan view of the semiconductor body composite, the predetermined breaking lines preferably run transversely, especially vertically, or parallel to the separation trenches. In particular, the separating gaps between the rows of semiconductor bodies are formed at the predetermined breaking lines. For example, a plurality of predetermined breaking locations of the predetermined breaking lines can be formed on a top surface of the substrate facing the semiconductor layer sequence.

The predetermined breaking locations can be formed throughout the semiconductor layer sequence into the substrate. In particular, the predetermined breaking locations are formed by scribing, sawing, etching and/or laser irradiation. The predetermined breaking location or predetermined breaking line is preferably wedge-shaped. Alternatively or in addition, the predetermined breaking locations can be formed on a bottom surface of the substrate facing away from the semiconductor layer sequence.

The predetermined breaking locations may be formed at least partially in the common substrate of the semiconductor body composite, in particular before the semiconductor body composite is applied to the carrier composite. Preferably, a thermal variation is carried out prior to the singulation of the carrier composite so that, due to the resulting thermally induced stresses, the semiconductor composite breaks at the predetermined breaking locations in rows and/or in columns of semiconductor bodies of the laser bars to be produced. For example, the temperature is varied by at least 100° C., 150° C., 200° C. or 250° C., for instance within a temperature range of −100° C. to 350° C.

For example, the semiconductor body composite is applied at an elevated temperature and followed by cooling, wherein the semiconductor body composite breaks into rows and/or in columns of semiconductor bodies of the laser bars to be produced due to the thermally induced stresses at the predetermined breaking locations during cooling. For example, the semiconductor body composite is applied at a soldering temperature of for instance 250° C. or 300° C., wherein at least in places, a temperature of the interconnected semiconductor body composite and carrier composite is reduced by at least 200° C. or 250° C. during cooling.

The semiconductor composite bodies may have an average coefficient of thermal extension that differs from an average coefficient of thermal extension of the carrier composite. For example, the average coefficients of thermal extension of the semiconductor body composite and of the carrier composite differ by at least 50%, 80%, 100%, 200% or by at least 300% from each other at a temperature of for instance 300 K. The semiconductor body composite may have a higher average coefficient of thermal extension than the carrier composite.

The semiconductor body composite may be based on GaAs. Preferably, the carrier composite is a silicon carrier. The substrate is in particular a GaAs substrate. At 300 K, GaAs has a thermal extension coefficient of about $6*10^{-6}$ $K^{-1}$. At 300 K, silicon has a coefficient of thermal extension of about $2.6*10^{-6}$ K. During cooling, the semiconductor body composite contracts more than the carrier composite and is broken into laser bars at the predetermined breaking lines. The laser bars are located in particular on the still contiguous carrier composite.

The carrier composite may be singulated into a plurality of carriers of the laser bars. For example, the carriers of the individual laser bars can be produced from the carrier composite using plasma etching or the so-called stealth dicing process. Each laser bar can have a plurality of semiconductor bodies on one common carrier. In particular, the semiconductor bodies are arranged in a row such as a single row on the common carrier. Along a lateral direction, two adjacent semiconductor bodies can be separated from each other by a separation trench or an insulating layer.

Each of the semiconductor bodies has a front side formed as a front face and a rear side facing away from the front face. The front side and the rear side of a semiconductor body are formed by surfaces of the semiconductor body exposed during singulation of the semiconductor composite in rows or columns of semiconductor bodies. In particular, the front side or the rear side of a semiconductor body is transverse or substantially perpendicular to a separation trench or to the insulating layer. The front side and the rear side of the semiconductor body can be mirrored, e.g. mirror-coated to form a resonator.

The singulating trenches may be formed in the carrier composite, for example, by plasma etching or a so-called stealth dicing method. In a plan view, the singulating trenches show in particular overlaps with the separating gaps between the rows of semiconductor bodies. Preferably, the separating gaps are each covered, in particular completely covered, by a singulating trench in the carrier composite.

The singulating trenches divide the carrier composite into a plurality of carriers for the laser bars. In particular, the singulating trenches are formed so broad that in a plan view, the semiconductor bodies of a laser bar have a lateral protrusion with respect to the associated common carrier. In particular, the front face of each individual semiconductor body is formed by a vertical surface of the protrusion. For example, a lateral extension of the lateral protrusion beyond the common carrier is at least 1 µm, at least 3 µm, at least 5 µm or at least 10 µm, in particular 1 µm to 30 µm.

In particular, the laser bar is configured such that a main emission direction of the individual semiconductor body is oriented transversely or perpendicularly to the front face. The main emission directions of the semiconductor bodies of the same laser bar are thus parallel to each other. A lateral protrusion of the semiconductor body beyond the common carrier thus prevents possible shadowing caused by the common carrier.

The laser bar may be separated into a plurality of semiconductor lasers. In particular, each of the individual semiconductor lasers has a carrier and a single semiconductor body arranged thereon. Preferably, the laser bar is singulated at the separation trenches. Since the separation trenches are filled for instance with an electrically insulating material, right after singulation, the resulting semiconductor lasers may already have an insulating layer on their side face or side faces.

A transistor or a plurality of transistors may be formed at least partially or completely within the carrier of the semiconductor laser or within the common carrier of the laser bar. This can be done, for example, by targeted doping specific subareas of the carrier or the common carrier. In particular, the transistor or the plurality of transistors is/are formed as field effect transistor/s, FET for short, as pnp-transistor/s or as npn-transistor/s in the carrier of the semiconductor laser or in the common carrier of the laser bar.

The transistor or the plurality of transistors may electrically connect throughout the carrier or throughout the common carrier to the semiconductor body or the plurality of semiconductor bodies. For example, a through-via can be formed in the carrier via which the semiconductor body directly electrically connects to one transistor. The carrier may have a plurality of such through-vias. In a plan view, the semiconductor body can cover, in particular completely cover its respective transistor and/or its respective through-via. Such a semiconductor laser or laser bar is free of a bond wire connection between the semiconductor body and one transistor.

Especially for ultrashort pulse applications, e.g. in the range of nanoseconds and below, an integration of one or a plurality of transistors in the carrier of a semiconductor laser or a laser bar is particularly suitable since an electrical connection between the semiconductor laser and the transistor can be realized over the shortest possible distance as a result of which the inductivity with respect to the wire contacting can be minimized. The reduction in inductivity means that ultra-short pulses in the nanosecond range and below can be generated using such semiconductor lasers or laser bars. This allows higher pulse powers to be achieved while taking relevant safety aspects into account.

The laser may comprise a carrier and a semiconductor body arranged thereon. The semiconductor body may have a vertically extending lateral front face. The semiconductor body may have a first semiconductor layer, a second semiconductor layer and an active zone located therebetween. In particular, the first semiconductor layer forms an n-side, the second semiconductor layer a p-side of the semiconductor laser, or vice versa. For example, the semiconductor body forms a diode structure. The active zone may be arranged in the vertical direction between the p-side and the n-side. When the semiconductor laser is in operation, the active zone may be configured to generate electromagnetic radiation. The semiconductor laser may be configured such that a main emission direction of the semiconductor laser is oriented transversely or perpendicularly to the front face.

Preferably, the semiconductor laser is free of a growth substrate. Alternatively, on a top surface of the semiconductor body remote from the carrier, the semiconductor laser may have a thinned growth substrate with a vertical layer thickness of 1 µm to 100 µm, in particular 1 µm to 50 µm, 5 µm to 40 µm, 10 µm to 30 µm, or 1 µm to 20 µm, for instance 3 µm to 10 µm.

In particular, such a semiconductor laser can be produced using one of the methods described above. The features described in connection with the semiconductor laser can therefore also be used for the methods and vice versa.

A transistor may at least be partially or completely formed within the carrier. Preferably, the transistor electrically connects directly to the semiconductor body throughout the carrier. For example, the carrier is made of silicon. In particular, the transistor is a field effect transistor such as a pnp-transistor or an npn-transistor.

For example, the p-side of the semiconductor laser faces the carrier and the n-side faces away from the carrier. The p-side is thus arranged between the n-side and the carrier. In particular, the transistor electrically connects to the p-side of the semiconductor laser. It is also possible that the p-side of the semiconductor laser faces away from the carrier and the transistor electrically connects to the n-side of the semiconductor laser facing towards the carrier.

In a plan view, the semiconductor body may have a lateral protrusion with respect to the carrier. The front face of the semiconductor body is formed by a vertical surface of the protrusion. The protrusion can be coated with a mirror layer. In particular, a lateral extension of the lateral protrusion over the carrier is at least 1 µm, at least 3 µm, at least 5 µm or at least 10 µm. For example, the lateral protrusion is 1 µm to 30 µm.

The semiconductor body may have a rear side facing away from the front face and a vertical side face adjacent to the front face and the rear side. Preferably, the front face and the rear side are mirrored, e.g. mirror coated to form a resonator. It is expedient to mirror-coat the front face and the rear side such that the front face has a lower reflectivity than the rear side. Preferably, the side face is covered, in particular completely covered with an insulating layer. The semiconductor body may have two opposite side faces each covered, in particular completely covered with an insulating layer. The insulating layer may show traces of separation from a mechanical separation process.

The laser bar may have a plurality of semiconductor bodies or a plurality of semiconductor lasers. In particular, such a laser bar can be produced using one of the methods described above. The laser bar can have a plurality of semiconductor bodies or semiconductor lasers described here. The features described in connection with the semiconductor bar can therefore also be used for the methods, the semiconductor bodies or the semiconductor lasers described here, and vice versa.

The laser bar may have a common contiguous carrier on which the semiconductor bodies of the semiconductor lasers are arranged. The carriers of the semiconductor lasers thus form the common carrier of the laser bar. The semiconductor lasers can comprise semiconductor bodies having structure of the same kind. The semiconductor bodies have structure of the same kind if they have an identical structural composition, in particular the same number of layers with the same layer thickness or the same layer structure made of the same materials. In particular, the semiconductor bodies are formed from the same semiconductor layer sequence.

Preferably, the semiconductor bodies of neighboring semiconductor lasers of the laser bar adjoin an insulating layer and are spaced apart by the insulating layer. Due to the insulating layer or layers, the semiconductor bodies or the semiconductor lasers of the same laser bar can be electrically isolated from each other and can be controlled individually by the transistors.

The common carrier is formed in particular in one piece. In particular, all semiconductor lasers are free of a growth substrate or each have a thinned growth substrate having a layer thickness, for example, of 1 µm to 100 µm. A common contact layer can be arranged between the carrier and the semiconductor bodies. It is possible that the insulating layers extend throughout the common contact layer so that on the p-side as well as on the n-side, the semiconductor bodies on the common carrier are electrically isolated from each other.

The laser bar may have a p-side contact layer formed as a common p-side contact layer all semiconductor lasers or for all semiconductor bodies of the laser bar. The semiconductor lasers of the same laser bar electrically connect to each other via the common contact layer. The common p-side contact layer is arranged in the vertical direction, in particular between the common carrier and the semiconductor bodies.

Especially for high power laser bars or for high current applications such as pulsed laser bars with a typical power up to 75 W and a typical operating current of 8 A to 30 A, a common p-contact is in many respects better suited than a common n-contact. For example, a simpler and more cost-effective driver electronics, namely the so-called n-MOS technology, can be used. In n-MOS technology, in particular, only n-channel metal oxide semiconductor field effect transistors (n-channel MOSFETs) are used that, compared to p-MOS technology, are significantly more energy and space-saving than p-channel MOSFETs.

Further advantages and developments of the method or the component will become apparent from the examples explained below in conjunction with FIGS. 1A to 8C.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

Figure 1B:
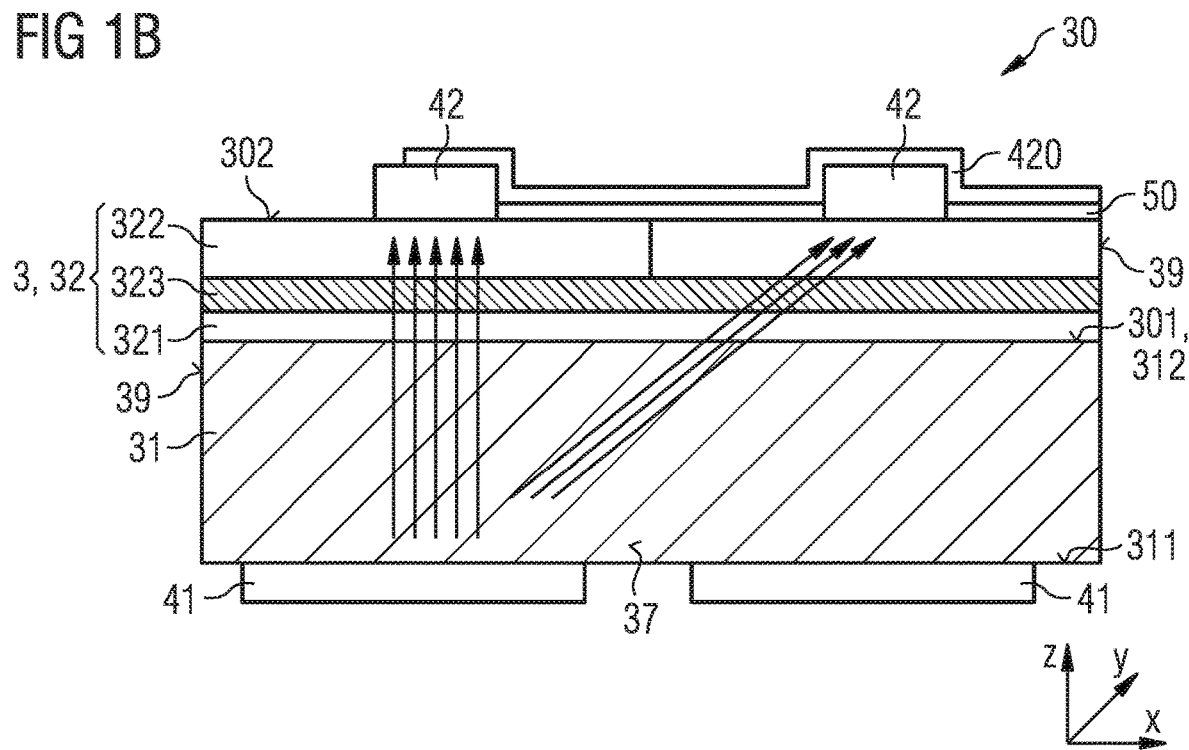

FIGS. 1A and 1B schematically show comparison examples of a semiconductor laser 1 and/or a laser bar 30 having a semiconductor body 3 on a substrate 31, in particular on a growth substrate 31. The semiconductor body 3 has a semiconductor layer sequence 32 having a first for instance n-side semiconductor layer 321, a second for instance p-side semiconductor layer 322 and an active zone 323 located therebetween. The active zone 323 is configured to generate electromagnetic radiation when the semiconductor laser 1 or laser bar 30 is in operation.

The substrate 31 has a top surface 312 facing the semiconductor body 3 and a bottom surface 311 facing away from the semiconductor body 3. The semiconductor body 3 has a bottom surface 301 facing the substrate and a top surface 302 facing away from the substrate. If the semiconductor body 3 is grown on the substrate 31, in particular epitaxially, the top surface 312 of the substrate or the bottom surface 301 of the semiconductor body 3 forms a common interface between the semiconductor body 3 and the substrate 31.

In particular, the substrate 31 is formed from a semiconductor material. The substrate 31 is electrically conductive along the vertical z-direction. Along the lateral x- or y-direction, the substrate 31 shows a comparatively low, but not vanishing electrical transverse conductivity. In FIGS. 1A and 1B, one or a plurality of laterally spaced first contact locations 41 are applied to the bottom surface of the substrate 311. One or a plurality of laterally spaced second contact locations 42 are arranged on the top surface 302 of the semiconductor body 3. The first contact locations 41 and the second contact locations 42 may be formed as n-side or p-side contact locations, or vice versa.

The contact locations 42 can electrically connect to each other via a common contact layer 420. An insulating layer 50 is also disposed on the top surface 302 of the semiconductor body 3 and located in the vertical direction between the semiconductor body 3 and the common contact layer 420. Along the lateral directions, the contact locations 42 can each be surrounded by the insulating layer 50.

The semiconductor body 3 has a front side 37 formed as a front face and a rear side 38 facing away from the front face 37. The semiconductor body 3 has further side faces 39 that connect the front side 37 with the rear side 38 and thus extend between the front side 37 and the rear side 38. The front side 37 and the rear side 38 of the semiconductor body 3 can be mirrored to form a resonator. In particular, the semiconductor laser 1 or the laser bar 30 is formed such that a main emission direction E is oriented transversely or perpendicularly to the front face 37. If the laser bar 30 has a plurality of semiconductor bodies 3, the main emission directions E of the semiconductor bodies 3 can be directed parallel to each other. The semiconductor laser 1 and the laser bar 30 are thus each configured as an edge emitter.

FIG. 1A shows the semiconductor laser 1 or the laser bar 30 in the yz plane. In the semiconductor laser 1, it may have a single first contact location 41 and a single second contact location 42. FIG. 1B shows a laser bar 30 in the xz plane. The laser bar 30 has a plurality of first contact locations 41 and a plurality of second contact locations 42.

The laser bar 30 may comprise a plurality of semiconductor bodies 3, each semiconductor body 3 being associated with at least one pair of the first contact location 41 and the second contact location 42. The semiconductor bodies 3 can be subregions of a common semiconductor layer sequence 32 grown on the common growth substrate 31. In lateral directions, the semiconductor bodies 3 can be spatially separated from each other. Due to the non-vanishing transverse conductivity of the growth substrate 31, the semiconductor bodies 3 and/or the semiconductor lasers 1 on the common growth substrate 31 can often be not controlled independently from each other, especially with an operating current of about 30 A and an operating voltage greater than 10 V. This is shown schematically in FIG. 1B by the arrows from a first contact location 41 in the direction of the two adjacent second contact locations 42.

FIGS. 2A to 2J schematically illustrate a method of producing a laser bar 30 having a plurality of semiconductor bodies 3, wherein the semiconductor bodies 3 are individually electrically controllable.

Figure 2A:
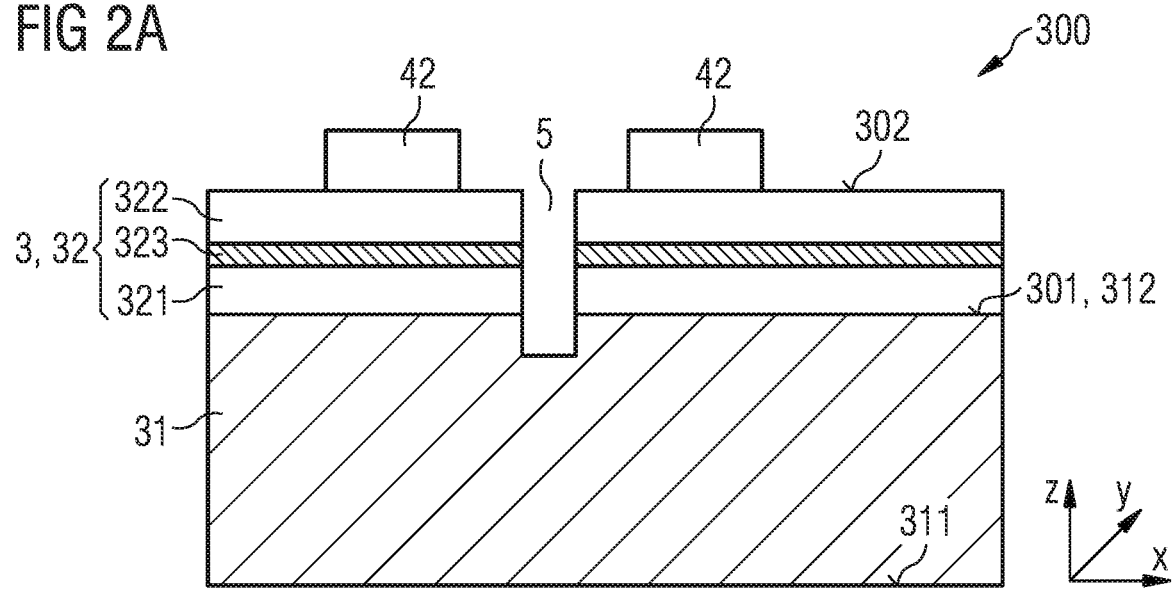
FIGS. 2A, 2B, 2C, 2D, 2E, 2F, 2G, 2H, 2I and 2J show different method steps of an example for production of laser bars and/or of semiconductor lasers in schematic sectional views.

According to FIG. 2A, a semiconductor body composite 300 is provided which comprises a common substrate 31 and a common semiconductor layer sequence 32 arranged thereon. In particular, the substrate 31 is a growth substrate such as a GaAs substrate. In particular, the semiconductor layer sequence 32 is epitaxially grown on the substrate 31. The semiconductor layer sequence 32 can be based also on GaAs, in particular on $Al_nGa_mIn_{1-n-m}As$ with $0 \leq n \leq 1$, $0 \leq m \leq 1$ and $n+m \leq 1$.

Figure 2B:
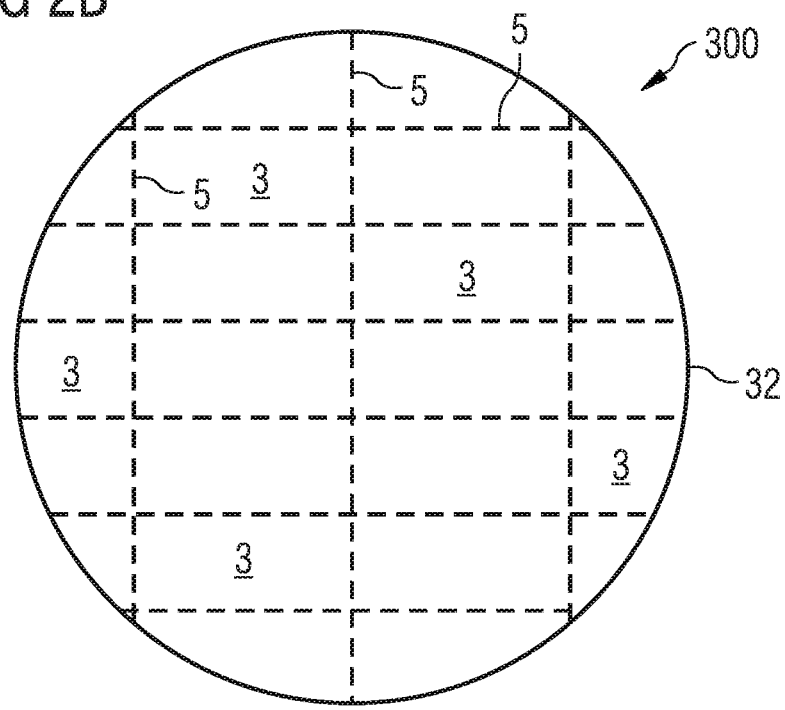

The example shown in FIG. 2A shows a section of the semiconductor body composite 300 at wafer level shown in FIG. 2B. The structural composition of this section is substantially the same as that of the laser bar 30 shown in FIG. 1B, except that, at this stage, the semiconductor body composite 300 is still free of the first contact locations 41, the insulating layer 50 and the common contact layer 420. As further differences to FIG. 1B, a plurality of separation trenches 5 are produced throughout the common semiconductor layer sequence 32 in accordance with FIGS. 2A and 2B, dividing the semiconductor body composite 300 into a plurality of semiconductor bodies 3.

Along the vertical direction, the separation trenches 5 can be generated from the top surface 302 of the semiconductor body 3 or of the semiconductor layer sequence 32 throughout the top surface of the substrate 312 into the substrate 31, for example, by deep etching. In a deviation from this, it is possible that the separation trenches 5 are formed such that they extend from the top surface 302 only as far as the top surface 312 of the substrate.

Figure 2C:
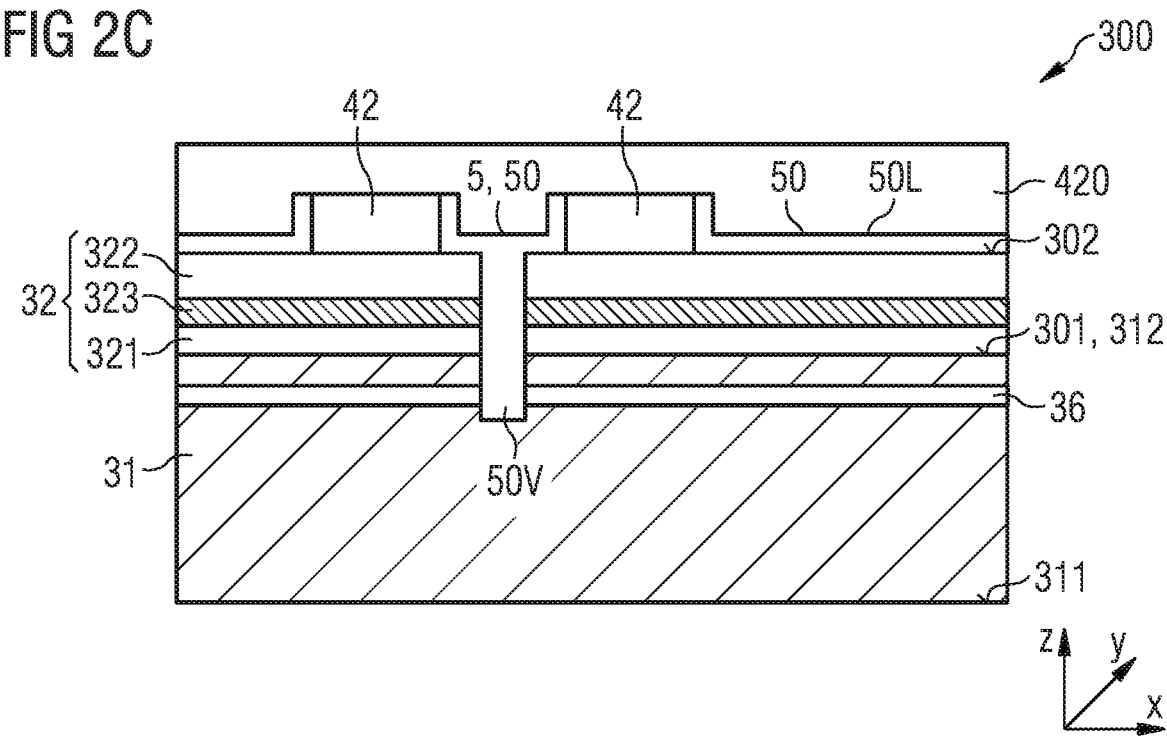

Optionally, an inner marking layer 36 can be formed in the semiconductor body composite 300, wherein the separation trenches 5 are formed as far as the marking layer 36 or throughout the marking layer 36. FIG. 2C shows that the marking layer 36 is located between the bottom surface 311 of substrate and the top surface 312 of the substrate, i.e. inside the substrate 31. Alternatively, it is possible for the marking layer 36 to be formed within the semiconductor layer sequence 32, for instance within the first semiconductor layer 31, or between the semiconductor layer sequence 32 and the substrate 31. Preferably, the marking layer is used as an etch stop layer formed for instance from a material that is more resistant to etching than the material of the semiconductor layer sequence 32.

The separation trenches 5 may have a depth which is, for example, 5 µm to 30 µm, for instance 5 µm to 20 µm, for instance 6 µm to 12 µm. Optionally, during or after formation of the separation trenches 5, a so-called ridge etching can be carried out. The semiconductor bodies 3 can be structured such that they each form a semiconductor body of a ridge laser or a laser bar of ridge lasers.

The separation trenches 5 are filled with an electrically insulating material according to FIG. 2C. The separation trenches 5 are thus passivated. By applying the electrically insulating material, an insulating layer 50 is formed. Neighboring semiconductor bodies 3 are thus spatially and electrically separated from each other by the insulating layer 50.

To form the insulating layer 50, the electrically insulating material can be applied to the semiconductor layer sequence 32. The insulating layer 50 has vertical regions 50V and lateral regions SOL. In particular, each of the regions 50V extending along the vertical direction completely fills one separation trench 5. The regions SOL extending along the lateral directions can completely cover the semiconductor layer sequence 32 or the semiconductor bodies 3, in particular with the exception of the second contact locations 42.

A common contact layer 420, especially on the p-side, can be formed on the insulating layer 50. The second contact locations 42 can electrically connect via the common contact layer 420. It is possible that the second contact locations 42 are in direct electrical contact with the common contact layer 420.

Figure 2D:
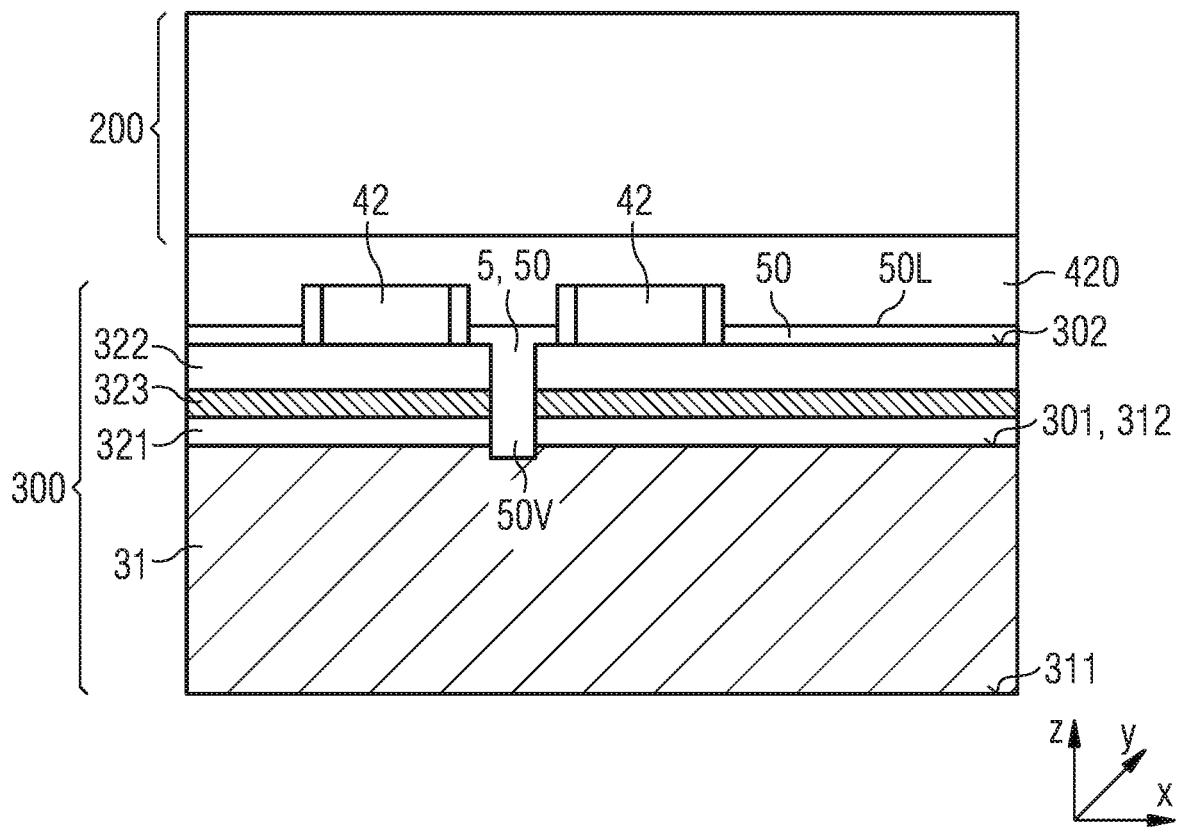

The semiconductor body composite 300 is applied to a carrier composite 200 as shown in FIG. 2D. The carrier composite 200 is preferably arranged on the semiconductor body composite 300 such that the separation trenches 5 face the carrier composite 200. The common contact layer 420 and the lateral regions SOL of the insulating layer 50 are arranged between the carrier composite 200 and the semiconductor body composite 300.

In particular, the carrier composite 200 has a higher average thermal conductivity than the semiconductor body composite 300. Preferably, the carrier composite 200 has a lower average coefficient of thermal extension than the semiconductor body composite 300. For example, the carrier composite 200 is made of silicon. It is possible that the carrier composite 200 is made of another semiconductor material, of an electrically insulating material or an electrically conductive material, for example, Si3N4, AlN or Ge.

Figure 2E:
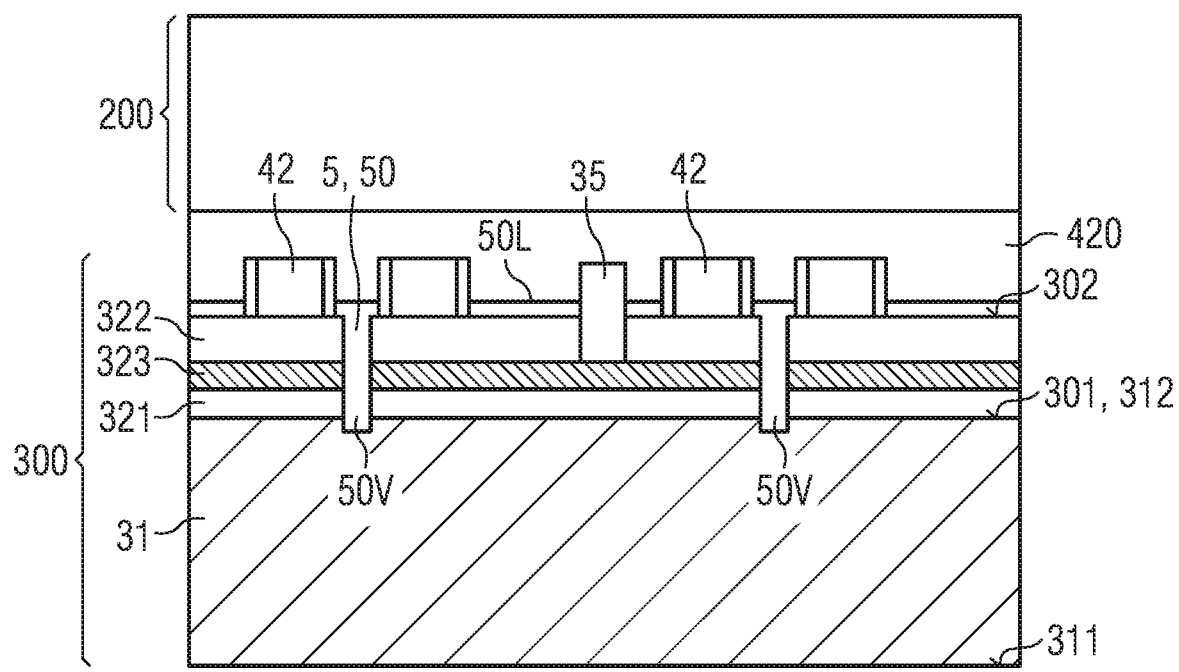

The example of a method step shown in FIG. 2E essentially corresponds to the example shown in FIG. 2D. In contrast, predetermined breaking locations 35 are formed in the semiconductor body composite 300, for example, by scribing, sawing, etching and/or laser irradiation. Preferably, the predetermined breaking locations 35 are in the immediate vicinity of a top surface 312 of the substrate 31 facing the semiconductor layer sequence 32. The predetermined breaking locations 35 can be formed through the semiconductor layer sequence 32 into the substrate 31. For example, the predetermined breaking locations 35 are formed before the semiconductor body composite 300 is attached to the carrier composite 200.

Figure 2F:
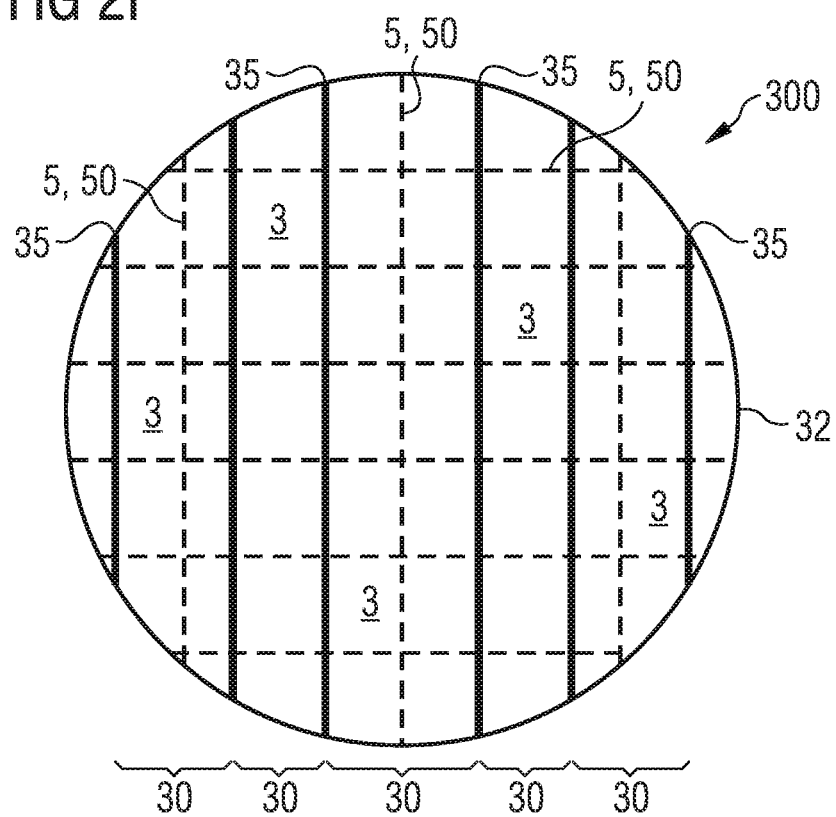

The predetermined breaking locations 35 form for instance predetermined breaking lines 35L shown in FIG. 2F in a plan view of the substrate 31. The predetermined breaking lines 35L define the geometry of the laser bars 30 to be produced. The predetermined breaking lines 35L run for instance transversely, in particular vertically or parallel to the separation trenches 5. Along the lateral directions, the predetermined breaking lines 35L extend for instance from one edge to another edge of the semiconductor body composite 300.

To singulate the semiconductor body composite 300 into a plurality of laser bars 30, a thermal variation can be carried out. In particular, the temperature of the semiconductor body composite 300 and/or of the carrier composite 200 shall be varied by at least 100° C., 150° C., 200° C. or 250° C. Due to the resulting thermally induced stresses, the semiconductor body composite 300 can break into a plurality of laser bars 30 at the predetermined breaking locations 35 and/or at the predetermined breaking lines 35L. For example, application of the semiconductor body composite 300 to the carrier composite 200 is carried out at an elevated temperature and followed by cooling.

Figure 2G:
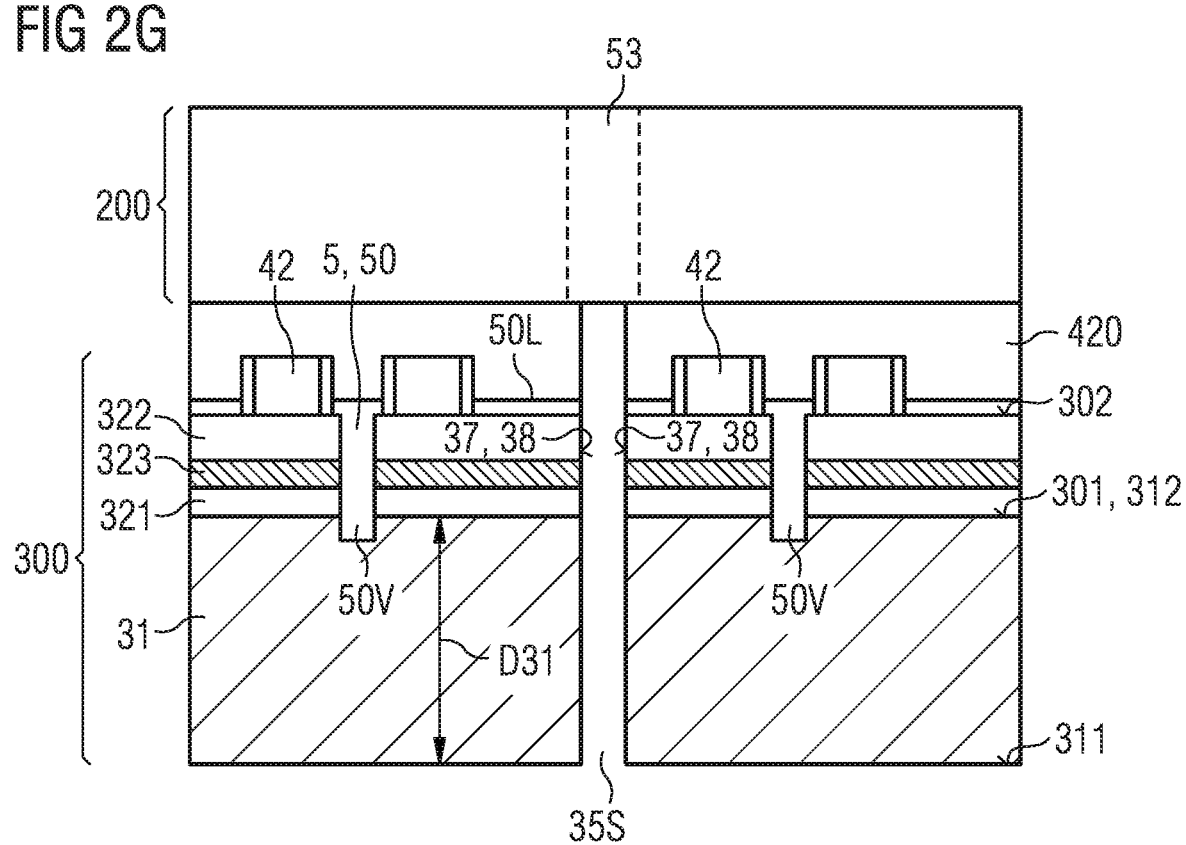

Separating gaps 35S are formed along the predetermined breaking lines 35L (FIG. 2G). The separating gaps 35S extend along the vertical direction, in particular throughout the substrate 31. The substrate 31 is thus divided into a plurality of subregions, wherein the subregions of the substrate 35 are separated by the separating gap 35S and each assigned to one of the laser bars 30. The laser bars 30 and/or the semiconductor bodies 3 have laser facets that form the side walls of the separating gap 35S, for example. The laser facets can be front faces or rear sides of laser bars 30 and/or of the semiconductor bodies 3. The laser facets can be mirrored to form a resonator.

The laser bars 30 are still arranged on the contiguous carrier composite 200. The laser bars 30 can each have a plurality of semiconductor bodies 3, wherein the semiconductor bodies 3 of the same laser bar 30 form for instance one row. The adjacent semiconductor bodies 3 of the same laser bar 30 can still be spatially separated by an insulating layer 50. Preferably, the laser bars 30 each have a single row of semiconductor bodies 3. It is also possible that some laser bars 30 have two or more rows of semiconductor bodies 3.

Alternatively or in addition, the predetermined breaking locations 35 or the predetermined breaking lines 35L can be formed on a bottom surface 311 of the substrate 31 facing away from the semiconductor layer sequence 32. Such predetermined breaking locations 7 (FIG. 5A) can be formed before or after attaching the semiconductor body composite 300 to the carrier composite 200.

Figure 2H:
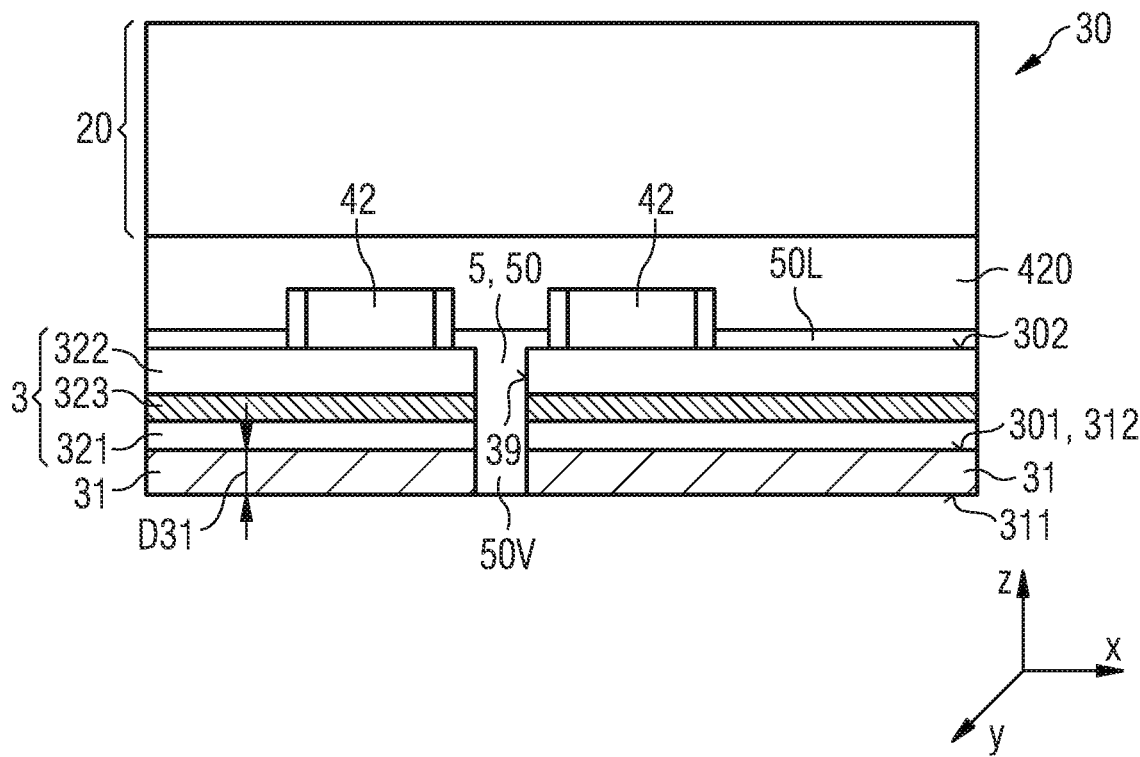

The substrate 31 is thinned according to FIG. 2H, for example, by a mechanical process such as grinding or a dry or wet chemical process such as etching. This can be done before or after separation of the carrier composite 200 into a plurality of carriers 20 of the laser bars 30. After separation of the carrier composite 200, the semiconductor bodies 3 of the same laser bar 30 are arranged on a common carrier 20 of the laser bar.

For example, the substrate 31 is thinned by at least 60% of its original vertical layer thickness D31, preferably by at least 70%, 80%, 90% or 95% of its original vertical layer thickness D31. After thinning, the substrate has a reduced vertical layer thickness D31 that is, for example, 1 μm to 100 μm. In particular, the insulating layer 50 or the vertical region 50V of the insulating layer 50 extends through the substrate 31 having the reduced layer thickness D31. It is also possible that the substrate 31 is completely removed from the semiconductor layer sequence 32 or from the semiconductor bodies 3.

Figure 2I:
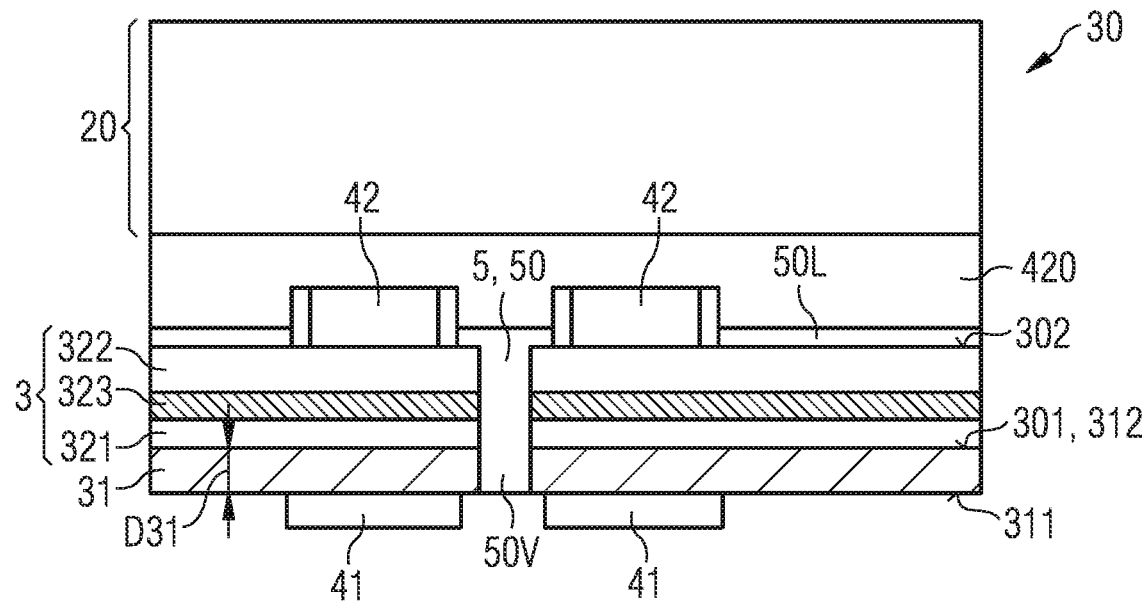

According to FIG. 2I, a plurality of first contact locations 41 are formed on the bottom surface 311 of substrate 31 having the reduced layer thickness D31. The first contact locations 41 are laterally spaced from each other and can each be assigned to one of the semiconductor bodies 3. The first contact locations 41 are configured to electrically contact the first semiconductor layers 321. The common contact layer 420 is configured to electrically contact the second semiconductor layers 322.

The first semiconductor layers 321 form in particular the n-side of the laser bar 30. The second semiconductor layers 321 form in particular the p-side of the laser bar 30. This is particularly useful for process reasons since, to achieve a high crystal quality, the first n-side semiconductor layers 321 are preferably grown on the substrate 31 prior to the active zone 323 and prior to the second p-side semiconductor layers 322. The semiconductor bodies 3 of the laser bar 30 can be individually electrically contacted via the separate first contact locations 41 and are therefore individually electronically controllable. The so-called n-MOS technology is particularly well suited for this purpose, where only n-channel metal oxide semiconductor field-effect transistors (n-channel MOSFETs) are used that are significantly more energy- and space-saving than p-channel MOSFETs.

Figure 2J:
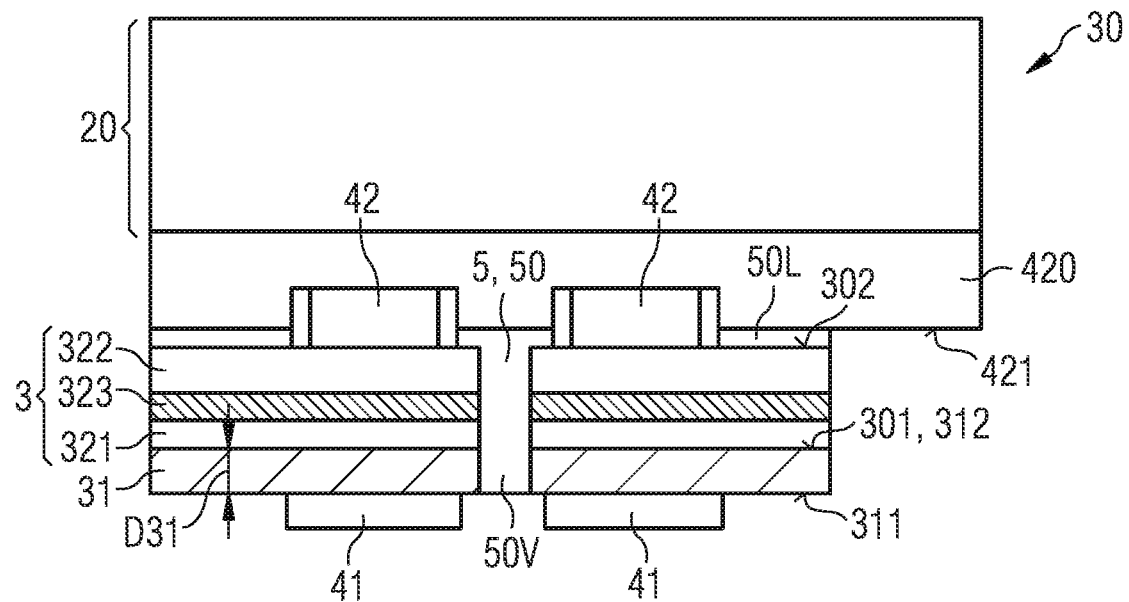

According to FIG. 2J, to form a connection location 421 of the common contact layer 420, the common contact layer 420 is exposed in places, for example, by etching an edge region of one semiconductor body 3. The laser bar 30 can thus be electrically contacted via a surface of the common contact layer 420 facing away from the common carrier 20 and via the bottom surface 311 of the substrate or via the bottom surface 301 of the semiconductor body 3, respectively. If the common carrier 20 is electrically conductive, the laser bar 3 can be electrically contacted, inter alia via the common carrier 20.

The example of a laser bar 30 shown in FIG. 3 corresponds essentially to the laser bar 30 shown in FIG. 2J. In contrast to this, the vertical region 50V of the insulating layer 50 is formed such that it extends throughout the common contact layer 420. The laser bar 30 can have a plurality of such vertical regions 50V. For example, the vertical regions 50V and the lateral regions 50L are formed to be continuous and thus form a single insulating layer 50 in one piece. In other words, the insulating layer 50 comprising the vertical and lateral regions 50V and 50L can be produced in a common in particular single process step.

The common contact layer 420 can have a number of laterally spaced subregions. Each subregion of the common contact layer 420 can have a partially exposed surface to form the connection location 421. The semiconductor bodies 3, in particular all semiconductor bodies 3, can be electrically connected and individually controlled on both the n-side and the p-side.

According to FIG. 4, the laser bar 30 is singulated into a plurality of semiconductor lasers 1. For this purpose, the common carrier 20 of the laser bar 30 can be divided into a plurality of carriers 2 of the semiconductor lasers 1 by generating a plurality of singulating trenches 53, for example, by plasma etching or by a stealth dicing method. Using stealth dicing, the crystal direction does not have to be precisely taken. Stealth dicing can be performed up to an uncertainty of 0.5°, 1° or 2°. In plasma etching, the orientation of the crystal direction plays no role.

In a plan view, the singulating trench 53 can be formed in the common carrier 20 of the laser bar 30 in an overlapping region with the vertical region 50V of the insulating layer 50. In other words, the singulating trenches 53 in the common carrier 20 of the laser bar 30 are preferably formed such that in a plan view, they overlap with a vertical region 50V of the insulating layer 50. Two adjacent semiconductor bodies 3 can be separated easily and without risk of damage through the vertical region 50V of the insulating layer 50. The vertical region 50V of the insulating layer 50 can thus serve as a protective layer for the semiconductor bodies 3 when the laser bar 30 is singulated into a plurality of semiconductor lasers 1.

The singulated semiconductor lasers 1 may each have a semiconductor body 3 comprising a side face 39 or two side faces 39 covered with an insulating layer 50 or with a vertical region 50V of the insulating layer 50. A lateral region SOL of the insulating layer 50 is arranged between the carrier 2 and the semiconductor body 3. For example, the lateral region SOL and the vertical region 50V or the vertical regions 50V are formed contiguously. The entire insulating layer 50 can be formed in one piece.

Figure 5A:
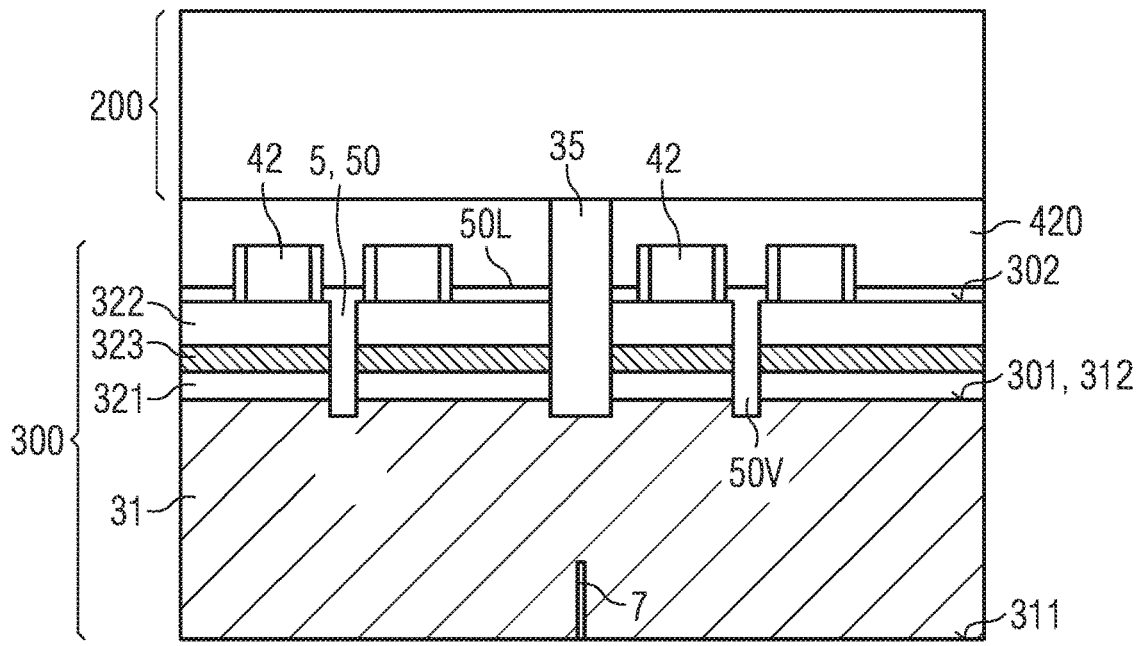
FIGS. 5A, 5B and 5C show different method steps of singulating a wafer into a plurality of laser bars or a laser bar into a plurality of semiconductor lasers in schematic sectional views.

The example for a method step shown in FIG. 5A essentially corresponds to the example shown in FIG. 2E. In contrast to this, FIG. 5A shows that the predetermined breaking location 35 of the carrier composite 200 extends throughout the common contact layer 420, while the semiconductor layer sequence 32 extends into the substrate 31. On the bottom surface 311 of the substrate, one or more further predetermined breaking locations 7 can be formed. The predetermined breaking locations 35 and 7 can each be wedge-shaped, for instance with the smallest cross-section inside the substrate 31.

Figure 5B:
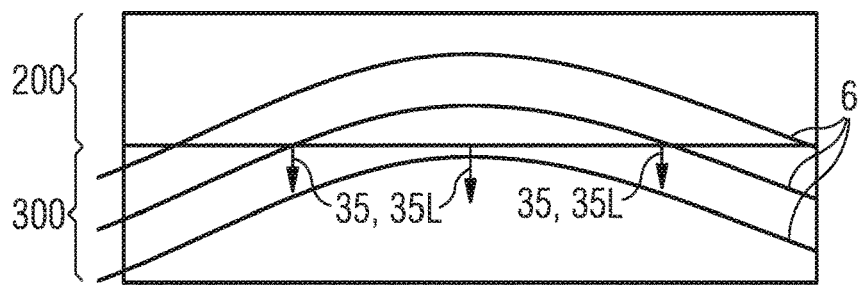

FIG. 5B schematically shows that the carrier composite 200, in particular made of silicon, and the semiconductor body composite 300, in particular based on GaAs, are joined at elevated temperature, for example, using a soldering process. The predetermined breaking locations 35 or the predetermined breaking lines 35L in the semiconductor body composite 300 face the carrier composite 200.

When the wafer component is cooled down after joining, tension is generated in the assembled wafer component, symbolized in FIG. 5B by tension lines 6. This results in a bend in the cooled state of the wafer component. In particular, the wafer component is curved like a bowl, wherein the semiconductor body composite 300 comprising the substrate 31 breaks along the predetermined breaking lines 35L in rows and/or in columns of semiconductor bodies 3. The rows or columns of semiconductor body 3 can form a plurality of laser bars 30 after singulating the carrier composite 200.

Figure 5C:
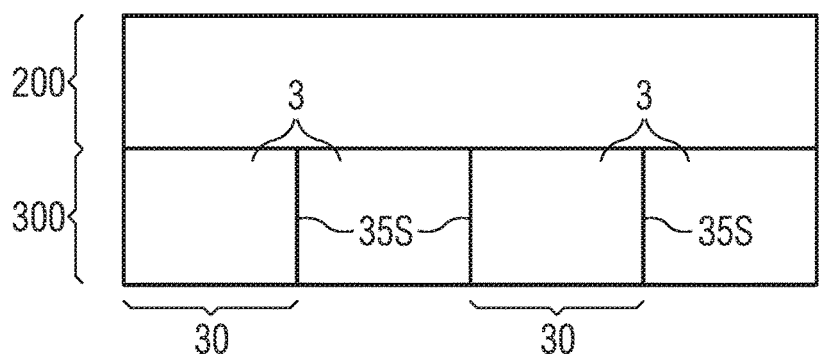

At first, neighboring rows or columns of the semiconductor bodies 3 in FIG. 5C are still arranged on the contiguous carrier composite 200 and laterally spaced from each other by separating gaps 35S. The separating gaps 35S are formed throughout the substrate 31. At the separating gaps 35S, the semiconductor bodies 3 have in particular broken edges which form the laser facets. Due to formation of the separating gaps 35S, the wafer component is no longer curved like a bowl and can be processed further easily.

In contrast to FIGS. 5A to 5C, the separating gaps 35S can be produced by a mechanical or chemical process such as scribing, etching or wet or dry chemical etching.

Figure 6A:
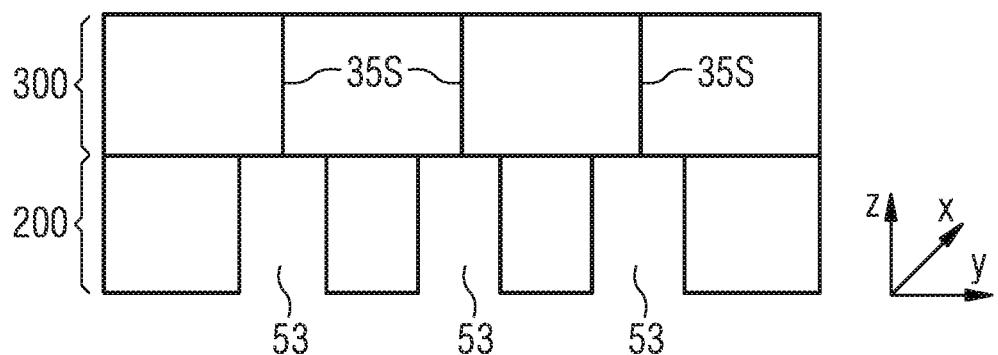
FIGS. 6A and 6B show further examples of different method steps of singulating a laser bar into a plurality of semiconductor lasers shown schematically for instance in FIG. 6C.
Figure 6B:
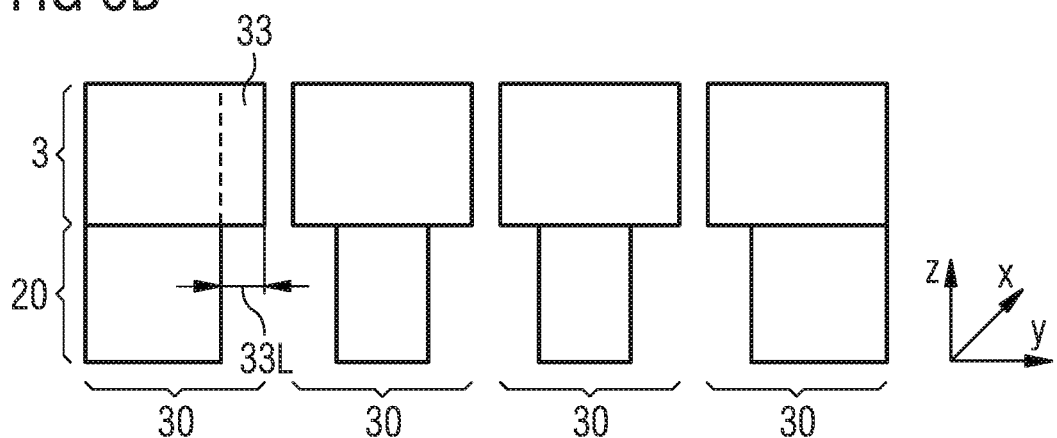

The method steps shown in FIGS. 6A and 6B essentially correspond to the method steps shown in FIGS. 2G and 2H to singulate a joined wafer component comprising the carrier composite 200 and the semiconductor body composite 300 into a plurality of laser bars 30.

Singulating trenches 53 are formed in the carrier composite 200, for example, by plasma etching. The singulating trenches 53 run in particular parallel to the separating gaps 35S in the semiconductor body composite 300. In a plan view, the singulating trenches 53 and the separating gaps 35S have overlaps. In particular, the singulating trenches 53 each have a larger width than the corresponding separating gaps 35S.

The singulating trenches 53 divide the carrier composite 200 into a plurality of 20 carriers for the 30 laser bars. The resulting laser bars 30 have a plurality of semiconductor bodies 3, each of which can have a lateral protrusion 33 with respect to the common carrier 20. For example, a lateral extension 33L of the lateral protrusion over the common carrier 33 is at least 1 μm, at least 3 μm, at least 5 μm or at least 10 μm, in particular 1 μm to 30 μm or 3 μm to 30 μm.

By the width of the singulating trenches 53, the protrusion 33 of the laser bar 30 or of the semiconductor laser 1 can be adjusted with high precision, namely with an accuracy of +/−5 μm, +/−3 μm or less.

In FIG. 6B, in contrast to FIG. 2H, a plurality of the semiconductor bodies 3 from the same laser bar 30 are not shown on a common carrier 20 for instance along the lateral x-direction. However, the semiconductor bodies 3 of the same laser bar 30 can form a continuous semiconductor layer sequence or be separated from each other by insulating layers 50 or 50V (FIG. 2H).

The common carrier 20 can be singulated into a plurality of carriers 2 by plasma etching. The laser bar 3 can be singulated into a plurality of semiconductor lasers 1, each semiconductor laser 1 having a semiconductor body 3 and a carrier 2 from the common carrier 20.

When singulating the laser bar 30 into a plurality of semiconductor lasers 1, all suitable method steps described here can be used analogously in connection with the singulation of the wafer component comprising the carrier composite 200 and the semiconductor body composite 300 into a plurality of laser bars 30 or analogously in connection with the singulation of the laser bar 30 into a plurality of semiconductor lasers 1. In particular, these include the method steps of forming the singulating trenches 53 and the protrusion 33 if the common carrier 20 of the laser bar 30 is flush with the semiconductor bodies 3 before singulation.

Figure 6C:
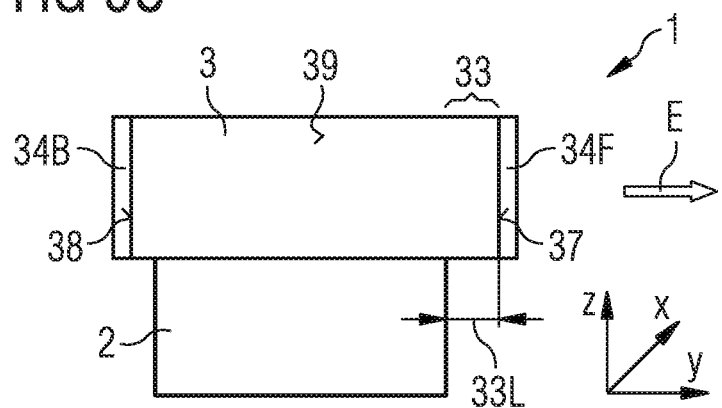

FIG. 6C shows a semiconductor laser 1 formed by singulating one of the laser bars 3 described in FIG. 6B. In a plan view, the semiconductor body 3 has a lateral protrusion 33 having a lateral extension 33L along the y-direction over the carrier 2. The front face of the semiconductor body 3 formed by the front side 37 may be formed by a vertical surface of the protrusion 33. In addition, the semiconductor body 3 has a further protrusion on the rear side 38. Deviating from FIG. 6C, it is possible that the semiconductor body 3 ends flush or essentially flush with the carrier 2 at its rear side 38. Within the production tolerances, along the lateral x-direction, the carrier 2 and the semiconductor body 3 optionally comprising the lateral insulating layer 5 or the lateral insulating layers 5 may have the same widths or substantially the same widths.

The main emission direction E of the semiconductor laser 1 is oriented transversely or perpendicularly to the front face 37. To form a resonator, the front side 37 and the rear side 38 opposite to the front side 37 of the semiconductor body 3 may be coated with a front-side mirror layer 34F and a rear-side mirror layer 34B, respectively. A side face 39 of semiconductor body 3, in particular perpendicular to the front face 37 and the rear side 38, may be covered by an insulating layer 50 or 50V as shown in FIG. 4.

The example shown in FIG. 7A for a semiconductor laser 1 essentially corresponds to the semiconductor laser 1 shown in FIG. 6C. In contrast, a transistor 8, in particular a field effect transistor 8, is integrated in the carrier 2.

For example, the transistor 8 is formed at least partially within carrier 2, e.g. by targeted doping in given subareas of the carrier 2. The three doped subareas 82 and 83 are shown schematically in FIG. 7A. The subarea 82 and subarea 83 are doped differently. For example, the subareas 82 are p-doped and subarea 83 is n-doped, or vice versa. Depending on the n- or p-doping of the subareas 82 and 83, a pnp-transistor or an npn-transistor can be formed in the carrier 2.

The semiconductor body 3 can be interconnected to the transistor 8 by a through-via 80 located, for example, inside the carrier 2 and extending throughout the carrier 2 as far as the contact layer 420 or as far as the contact location 42. On a surface of carrier 2 facing away from the semiconductor body 3, the transistor 8 has a number of contact locations 81, in particular exactly three contact locations 81 of the transistor 8. Inter alia, the transistor 8 can act as a switch for the semiconductor body 3. In a plan view of the carrier 2, the semiconductor body 3 can at least partially or completely cover the through-via 80 and/or the entire transistor 8.

In FIG. 7A, the transistor 8 having the subareas 82 and 83 is formed on a side of the carrier 2 facing away from the semiconductor body 3. It is possible that the transistor 8 is formed on a side of the carrier 2 facing the semiconductor body 3. In this example, the subareas 82 and 83 face the semiconductor body 3. For example, by the through-vias in the carrier 2, in particular by exactly three through-vias, the subareas 82 and 83 can be electrically conductively connected to the contact locations 81.

FIG. 7B shows a semiconductor laser 1 as shown in FIG. 4 having a transistor 8 as shown in FIG. 7A.

FIG. 7C shows a laser bar 30 according to FIG. 2H having a transistor 8 according to FIG. 7A.

Figure 7D:
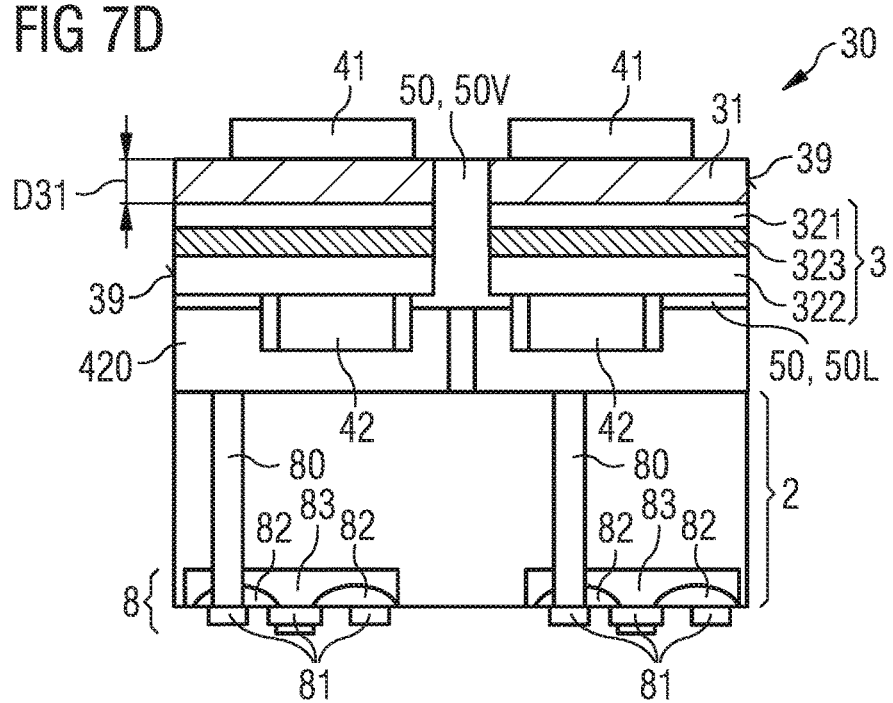

FIG. 7D shows a laser bar 30 substantially as shown in FIG. 3 having a plurality of transistors 8 as shown in FIG. 7A. In particular, each of the transistors 8 is associated with one of the semiconductor bodies 3 of the laser bar 30, and/or vice versa. The laser bars 30 shown in FIGS. 2I and 2J can also have a carrier 20 comprising an integrated transistor 8.

Each of the second semiconductor layers 322 shown in FIGS. 7B, 7C and 7D preferably forms a p-side of the respective semiconductor body 3. Each of the first semiconductor layers 321 preferably forms an n-side of the respective semiconductor body 3. Vice versa, it is possible that each of the second semiconductor layers 322 forms an n-side and each of the first semiconductor layers 321 forms a p-side of the respective semiconductor body 3. The semiconductor bodies 3 of the laser bar 30 shown in FIG. 7D can be individually controlled via the spatially and electrically separated transistors 8. In this example, the first contact locations 41 can be contiguous or electrically connected by a common contact layer.

Figure 8A:
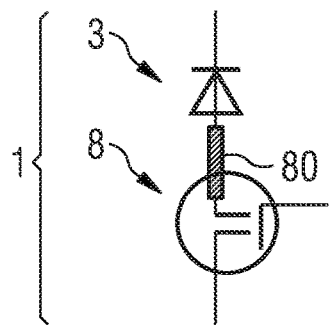
FIGS. 8A and 8B show schematic diagrams of circuit diagrams with a semiconductor laser or with a laser bar.

FIG. 8A shows a circuit diagram with a semiconductor laser 1 according to FIGS. 7A and 7B. The electrical connection between the semiconductor body 3 that in particular has a diode structure, and the transistor 8 can be achieved via the shortest possible distance between the semiconductor body 3 and the transistor 8, i.e. via through-via 80. This minimizes the inductivity with respect to the wire contacting. The reduction in inductivity means that ultrashort pulses in the nanosecond range and below can be generated by using such a semiconductor laser 1.

Figure 8B:
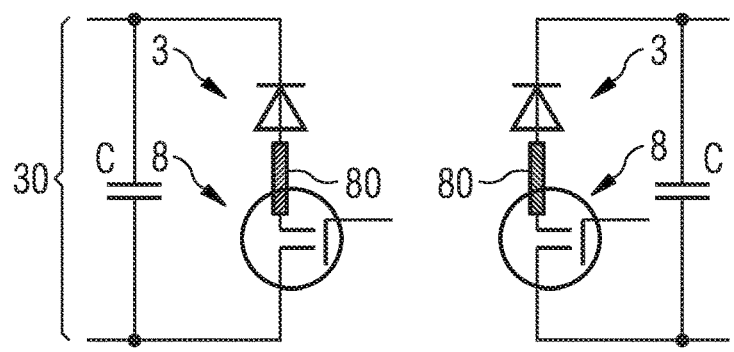

FIG. 8B shows a circuit diagram with a laser bar 30 according to FIG. 7D. The semiconductor bodies 3 of the laser bar 30 can be individually controlled via the transistors 80 integrated in the common carrier 20. FIG. 8B also shows capacitors C connected in parallel to the semiconductor body 3 and the transistor 8. The capacitors C can be arranged outside or inside the common carrier 20.

This application claims priority of DE 10 2017 108 385.5, the subject matter of which is incorporated herein by reference.

Our laser bars, semiconductor lasers and methods are not restricted to the examples by the description made with reference to examples. This disclosure rather comprises any novel feature and any combination of features, including in particular any combination of features in the appended claims, even if the feature or combination is not itself explicitly indicated in the claims or examples.

The invention claimed is:

1. A method of producing laser bars or semiconductor lasers comprising:

providing a carrier composite to form a plurality of carriers for the laser bars or for the semiconductor lasers;

providing a semiconductor body composite comprising a common substrate and a common semiconductor layer sequence grown thereon;

forming a plurality of separation trenches through the common semiconductor layer sequence such that the semiconductor body composite is divided into a plurality of semiconductor bodies;

applying the semiconductor body composite to the carrier composite such that the separation trenches face the carrier composite;

thinning or removing the common substrate; and singulating the carrier composite into the plurality of carriers, wherein the plurality of semiconductor bodies are arranged on one of the carriers, and the semiconductor bodies arranged on one common carrier are laterally spaced apart from one another by the separation trenches, wherein the method further comprises at least one of features i-vi:

i. the separation trenches are filled with an electrically insulating material before the semiconductor body composite is applied to the carrier composite, and the electrically insulating material forms an insulating layer so that the semiconductor lasers resulting therefrom already have an insulating layer on their side faces right after the singulation;

ii. the semiconductor body composite comprises an inner marking layer, the separation trenches are formed up to the marking layer or throughout the marking layer, and the substrate is thinned or removed from a bottom surface of the substrate remote from the semiconductor layer sequence up to the marking layer;

iii. the substrate is thinned by at least 60% of its original vertical layer thickness and after thinning has a reduced vertical layer thickness of 1 µm to 100 µm;

iv. the semiconductor layer sequence has an n-side facing away from the carrier composite, a p-side facing towards the carrier composite and an active zone located there between, the plurality of semiconductor bodies on the common carrier have a common p-side contact layer arranged between the common carrier and the plurality of semiconductor bodies, each of the plurality of semiconductor bodies has an n-side contact location, and the n-side contact locations of different semiconductor bodies are spatially separated from one another and the plurality of semiconductor bodies are individually controllable via the n-side contact locations;

v. predetermined breaking locations are formed at least partially in the common substrate of the semiconductor body composite, and a thermal variation is carried out prior to the singulation of the carrier composite so that due to the resulting thermally induced stresses, the semiconductor composite breaks into at least one of rows or columns of the plurality of semiconductor bodies of the to be produced laser bars at the predetermined breaking locations; and vi. a transistor is formed at least partially within the carrier of the semiconductor laser or of the laser bar.

2. The method according to claim 1, further comprising feature i, wherein the electrically insulating material is applied flatly to the semiconductor layer sequence so that the insulating layer is formed such that it not only fills the separation trenches but completely covers the semiconductor layer sequence except for electrical contact locations.

3. The method according to claim 1, wherein the separation trenches are formed throughout the semiconductor layer sequence into the common substrate.

4. The method according to claim 1, wherein predetermined breaking lines are formed in the semiconductor body composite,
the predetermined breaking lines define the geometry of the laser bars to be produced, and
in a plan view of the semiconductor body composite, the predetermined breaking lines run transversely or parallel to the separation trenches.

5. The method according to claim 1, wherein the laser bar is singulated at the separation trenches to form a plurality of semiconductor lasers, each of the semiconductor lasers having a carrier and a single semiconductor body arranged thereon.

6. The method according to claim 1, wherein the semiconductor body composite is based on GaAs and the carrier composite is a silicon carrier.

7. A semiconductor laser comprising a carrier and a semiconductor body arranged thereon, wherein
the semiconductor body has a vertically extending lateral front face,
the semiconductor body comprises a first semiconductor layer, a second semiconductor layer and an active zone disposed in a vertical direction between the first and second semiconductor layers,
in operation of the semiconductor laser, the active zone is configured to generate electromagnetic radiation, a main emission direction of the semiconductor laser being oriented transversely to the front face,
the semiconductor laser is free of a growth substrate or on a top surface of the semiconductor body facing away from the carrier, has a thin growth substrate having a vertical layer thickness of 1 µm to 100 µm, and wherein the semiconductor laser comprises at least one of features i-iii:
i. a transistor is at least partially formed within the carrier and the transistor electrically connects directly to the semiconductor body throughout the carrier;
ii. in a plan view, the semiconductor body has a lateral protrusion with respect to the carrier, and the front face of the semiconductor body is formed by a vertical surface of the protrusion and a lateral extension of the lateral protrusion with respect to the carrier is least 1 µm; and
iii. the semiconductor body has a rear side facing away from the front face and a vertical side face adjoining the front face and the rear side, the front face and the rear side are mirrored to form a resonator, and the side face is covered with an insulating layer.

8. A laser bar comprising a plurality of semiconductor lasers according to claim 7, wherein
carriers of the semiconductor lasers comprise a common continuous carrier,
the semiconductor lasers comprise semiconductor bodies having structure of the same kind, and
the semiconductor bodies of the neighboring semiconductor lasers are adjacent to an insulating layer and spaced apart from each other by the insulating layer.

9. The laser bar according to claim 8, having a p-side contact layer as a common p-side contact layer for all semiconductor bodies of the laser bar, wherein the common p-side contact layer is arranged in the vertical direction between the common continuous carrier and the semiconductor bodies.

10. A semiconductor laser comprising a carrier and a semiconductor body arranged thereon, wherein
the semiconductor body has a vertically extending lateral front face,
the semiconductor body comprises a first semiconductor layer, a second semiconductor layer and an active zone disposed in a vertical direction between the first and second semiconductor layers,
in operation of the semiconductor laser, the active zone is configured to generate electromagnetic radiation, a main emission direction of the semiconductor laser being oriented transversely to the front face,
the semiconductor laser is free of a growth substrate or on a top surface of the semiconductor body facing away from the carrier, has a thin growth substrate having a vertical layer thickness of 1 µm to 100 µm,
a transistor or a plurality of transistors is/are generated at least partially or completely within the carrier of the semiconductor laser, and
the transistor electrically connects directly to the semiconductor body throughout the carrier.

* * * * *